United States Patent
Lewis

(10) Patent No.: US 8,384,415 B2
(45) Date of Patent: Feb. 26, 2013

(54) METHOD AND SYSTEM FOR IDENTIFYING COUNTERFEIT PROGRAMMABLE LOGIC DEVICES

(76) Inventor: James M. Lewis, Moulton, AL (US)

( * ) Notice: Subject to any disclaimer, the term of this patent is extended or adjusted under 35 U.S.C. 154(b) by 0 days.

(21) Appl. No.: 13/397,232

(22) Filed: Feb. 15, 2012

(65) Prior Publication Data

US 2012/0212253 A1 Aug. 23, 2012

Related U.S. Application Data

(60) Provisional application No. 61/442,955, filed on Feb. 15, 2011.

(51) Int. Cl.
*H03K 19/00* (2006.01)
(52) U.S. Cl. .............................................. 326/8; 326/38
(58) Field of Classification Search ................ 326/8, 37, 326/38, 54; 708/490, 530
See application file for complete search history.

(56) References Cited

U.S. PATENT DOCUMENTS

| | | |
|---|---|---|
| 2002/0154767 A1 | 10/2002 | Endo et al. |
| 2002/0166057 A1 | 11/2002 | Kaminaga et al. |
| 2003/0009503 A1 | 1/2003 | Glaser et al. |
| 2008/0216051 A1 | 9/2008 | Johnson et al. |
| 2010/0213951 A1 | 8/2010 | Lewis |
| 2011/0148457 A1* | 6/2011 | Abramovici ............ 326/8 |

* cited by examiner

*Primary Examiner* — Don Le
(74) *Attorney, Agent, or Firm* — Welsh Flaxman & Gitler LLC

(57) ABSTRACT

A method for combating counterfeiting and tampering of integrated circuits includes the steps providing a programmable logic device, the programmable logic device including an arithmetic circuit implemented into the substrate, and constructing an arithmetic feedback oscillator using the arithmetic circuit. The step of constructing the arithmetic feedback oscillator includes incorporating a feedback loop into the arithmetic circuit and feeding output bits back into an input of the arithmetic circuit. The method also includes the step of selecting input values producing repeating values in a lesser order bit of a product of the arithmetic circuit when first and second input are applied to the arithmetic circuit and monitoring the lesser order bit and determining a predicted pattern.

24 Claims, 35 Drawing Sheets

Simple Ring Oscillator

Basic Arithmetic Feedback Oscillator
implement with a Binary Multiplier

Binary Multiplier Feedback Oscillator with
Feedback Multiplexer (Mux)

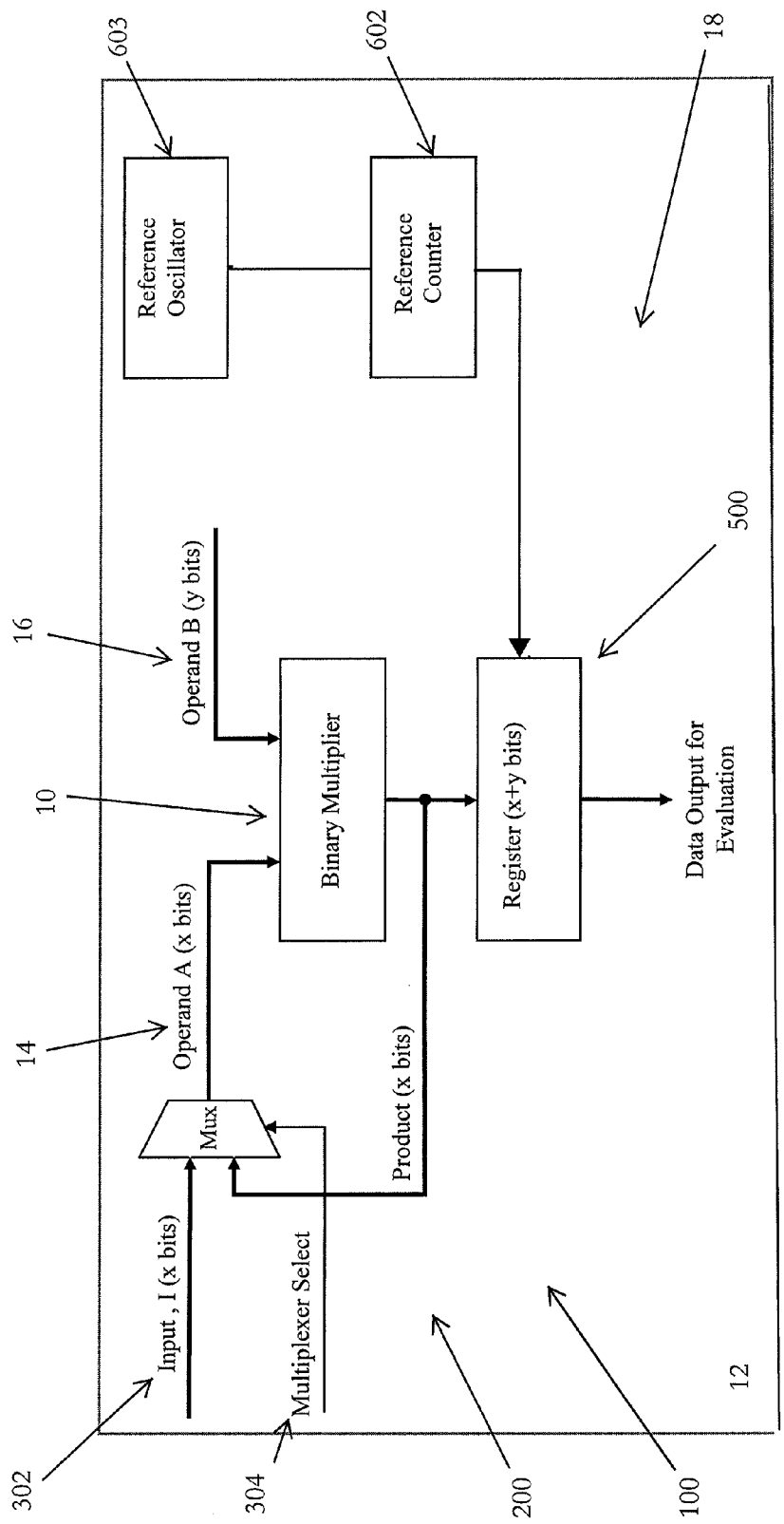

FIG. 11

Multiplier Feedback Oscillator with Output Register for Data Evaluation

The data produced is random since each part of the multiplier is operating based on the intrinsic delays of the multiplier implementation. The rate of change of the multiplier output is random. Sampling this random data at a regular rate produces a random output. This system may be used as a random number generator.

Binary Adder Configured as an Adder Feedback Oscillator

Three plus One output of Adder Feedback Oscillator

Output of Adder Feedback Oscillator with Various Inputs

Divider Feedback Oscillator

Divider Feedback Oscillator timing diagram for 0xFF7B divided by 0x47

Divider Feedback Oscillator timing diagram for 0xFCBD divided by 0x47

Divider Feedback Oscillator timing diagram for 0xFBFA divided by 0x47

Divider Feedback Oscillator timing diagram for 0xFBED divided by 0x47

Divider Feedback Oscillator timing diagram for 0xFBE0 divided by 0x47

Divider Feedback Oscillator timing diagram for 0xFBD3 divided by 0x47

Divider Feedback Oscillator timing diagram for 0xFBC6 divided by 0x47

Divider Feedback Oscillator timing diagram for 0xFB85 divided by 0x47

Divider Feedback Oscillator timing diagram for 0xFA67 divided by 0x47

Divider Feedback Oscillator timing diagram for 0xFA33 divided by 0x8B

Divider Feedback Oscillator timing diagram for 0xFA8E divided by 0x47

Divider Feedback Oscillator timing diagram for 0xF85F divided by 0x47

Divider Feedback Oscillator timing diagram for 0xFB44 divided by 0x47

US 8,384,415 B2

METHOD AND SYSTEM FOR IDENTIFYING COUNTERFEIT PROGRAMMABLE LOGIC DEVICES

CROSS REFERENCE TO RELATED APPLICATION

This application claims the benefit of U.S. Provisional Patent Application Ser. No. 61/442,955, entitled "METHOD AND SYSTEM FOR IDENTIFYING COUNTERFEIT PROGRAMMABLE LOGIC DEVICES", filed Feb. 15, 2011.

BACKGROUND OF THE INVENTION

1. Field of the Invention

The present invention relates to the implementation of a family of arithmetic feedback oscillators in a programmable logic device (PLD) for the purpose of combating counterfeiting and tampering. The present invention assists security personnel to ensure (that is, authenticate) that the specific integrated circuit(s) that was originally installed (or intended for installation) in a sensitive system is, in fact, installed.

2. Description of the Related Art

Counterfeit programmable logic devices, for example, integrated circuits, pose major problems with regard to the potential for electronic hacking and terrorism. Counterfeit integrated circuits contain a multitude of functionalities which may not be readily determined through simple assessment of the integrated circuit. Some of these functionalities may lie dormant until accessed or activated by an operator aware of the hidden functionality.

Even once detected, counterfeit programmable logic devices are integrated into a hardware component and the problems associated therewith may not commonly be fixed with a simple patch or other software based repair. Rather, each counterfeit integrated circuit must be removed and replaced.

Accordingly, a method and system for identifying counterfeit integrated circuits is needed. The present invention provides such a method and system.

SUMMARY OF THE INVENTION

It is, therefore, an object of the present invention to provide a method for combating counterfeiting and tampering of integrated circuits. The method includes the steps of providing a programmable logic device, the programmable logic device including a multiplier implemented into the substrate and constructing a multiplier feedback oscillator using the multiplier. The step of constructing the multiplier feedback oscillator includes incorporating a feedback loop into the multiplier and feeding least significant product bits back into one of operand inputs. The method further includes selecting input values producing repeating values in a lesser order bit of a product of the multiplier when first and second operands are applied to the multiplier and monitoring the lesser order bit and determining a predicted pattern.

It is also an object of the present invention to provide a method including the further steps of obtaining a test integrated circuit and testing to determine if the predicted pattern is produced by the test integrated circuit.

It is another object of the present invention to provide a method wherein the lesser order bit is the zeroth product bit, the $1^{st}$ product bit or the $2^{nd}$ product bit.

It is a further object of the present invention to provide a method wherein the multiplier is a binary multiplier.

It is also an object of the present invention to provide a method wherein the feedback loop includes a multiplexer.

It is another object of the present invention to provide a method wherein two's complement signed multiplication is employed in the multiplier.

It is a further object of the present invention to provide a method including a binary counter associated with each output bit of the multiplier feedback oscillator.

It is also an object of the present invention to provide a method wherein each binary counter receives output bits of the multiplier feedback oscillator for evaluating the frequency of change of the output bits of the multiplier.

It is another object of the present invention to provide a method wherein each of the binary counters produces a time interval over which the bit counters are allowed to operate (or to count over a frequency).

It is a further object of the present invention to provide a method including a register connected to outputs of the multiplier to evaluate the output of the multiplier feedback oscillator.

It is also an object of the present invention to provide a method wherein a time interval generated by a clock or a binary counter is used to control the rate at which data is latched into the register.

It is another object of the present invention to provide a method for combating counterfeiting and tampering of integrated circuits. The method includes providing a programmable logic device, the programmable logic device including an arithmetic circuit implemented into the substrate; constructing an arithmetic feedback oscillator using the arithmetic circuit wherein the step of constructing the arithmetic feedback oscillator includes incorporating a feedback loop into the arithmetic circuit and feeding output bits back into an input of the arithmetic circuit; selecting input values producing repeating values in a lesser order bit of a product of the arithmetic circuit when first and second input are applied to the arithmetic circuit; monitoring the lesser order bit and determining a predicted pattern.

It is a further object of the present invention to provide a method wherein the arithmetic circuit is a binary adder.

It is also an object of the present invention to provide a method wherein the arithmetic circuit is a binary divider.

It is another object of the present invention to provide a method wherein the feedback loop includes an XOR function.

It is a further object of the present invention to provide a method wherein the feedback loop includes a logic function.

It is also an object of the present invention to provide a method wherein the feedback loop includes a binary adder.

It is another object of the present invention to provide a method wherein the arithmetic circuit is a binary multiplier.

It is a further object of the present invention to provide a method wherein the arithmetic circuit is an Arithmetic Logic Unit.

Other objects and advantages of the present invention will become apparent from the following detailed description when viewed in conjunction with the accompanying drawings, which set forth certain embodiments of the invention.

BRIEF DESCRIPTION OF THE DRAWINGS

FIG. 11 is a schematic of the multiplier feedback oscillator shown with reference to FIG. 4 including an output register for data evaluation.

DESCRIPTION OF THE PREFERRED EMBODIMENTS

The detailed embodiments of the present invention are disclosed herein. It should be understood, however, that the disclosed embodiments are merely exemplary of the invention, which may be embodied in various forms. Therefore, the details disclosed herein are not to be interpreted as limiting, but merely as a basis for teaching one skilled in the art how to make and/or use the invention.

The present invention provides a method and system for combating counterfeiting and tampering in the field of integrated circuits. Current programmable logic devices include arithmetic circuitry already implemented into the silicon substrate. The present invention utilizes a family of arithmetic feedback oscillators, for example, a multiplier feedback oscillator, an adder feedback oscillator, and a divider feedback oscillator in a programmable logic device (PLD) to implement a test circuit or sensor for the purpose of combating counterfeiting and tampering. The implementation of the present invention assists security analysts to ensure the specific integrated circuit that was originally installed (or intended for installation) in a sensitive system is, in fact, installed. The present invention allows for authentication of digital devices such as PLD, FPGA (field programmable gate arrays), and microprocessors. That is, the present invention provides for the unique identification of seemingly identical digital components. Also the present invention is capable of distinguishing similarities (as well as differences) in related components such as components processed from the same foundry, with the same process, components of similar age, components manufactured (created) by the same manufacturer.

As discussed above, many PLDs now include fast multipliers 10 implemented in the silicon of the PLD 12. These multipliers 10, in their most basic form, are represented by the schematic shown in FIG. 1.

Figure 1:
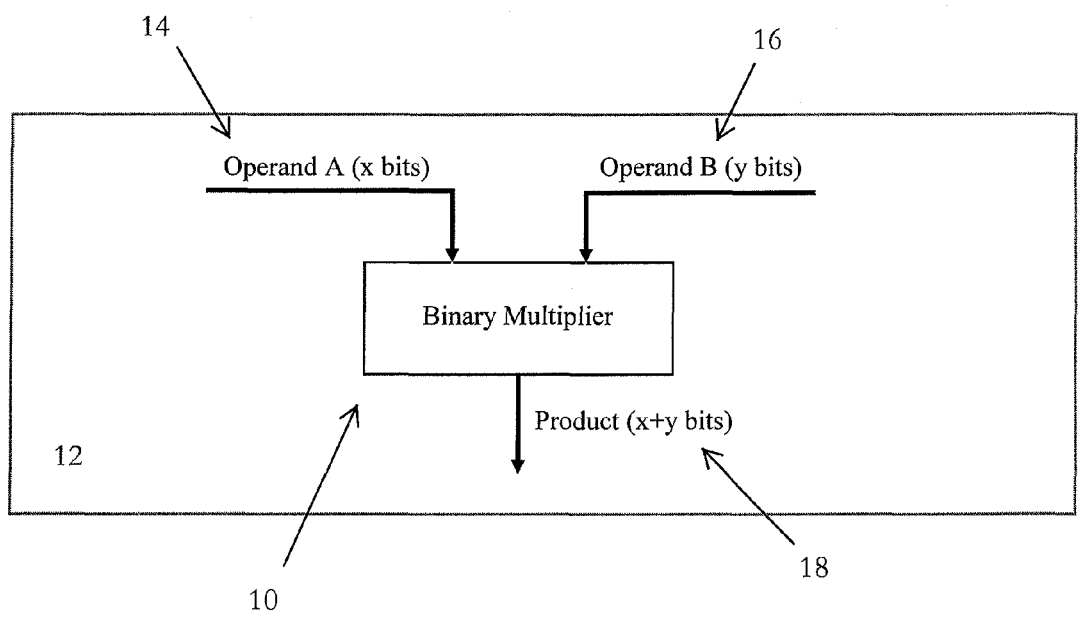
FIG. 1 is a schematic showing a binary multiplier implementation.

As shown in FIG. 1, the typical binary multiplier 10 implementation includes two input values, Operands A and B 14, 16, and an output result, the product 18. The operands 14, 16 may be any arbitrary bit width. The operands 14, 16 need not be the same bit width, but may be depending on the application. The bit width of the product output 18 is sum of the bit widths of the input operands 14, 16, that is, a multiplier with two 8-bit inputs produces a 16-bit result.

The initial discussion of multipliers primarily focuses upon unsigned binary integers. That is, values that are positive whole numbers represented in the traditional binary nomenclature. Negative numbers are discussed later.

Figure 2:
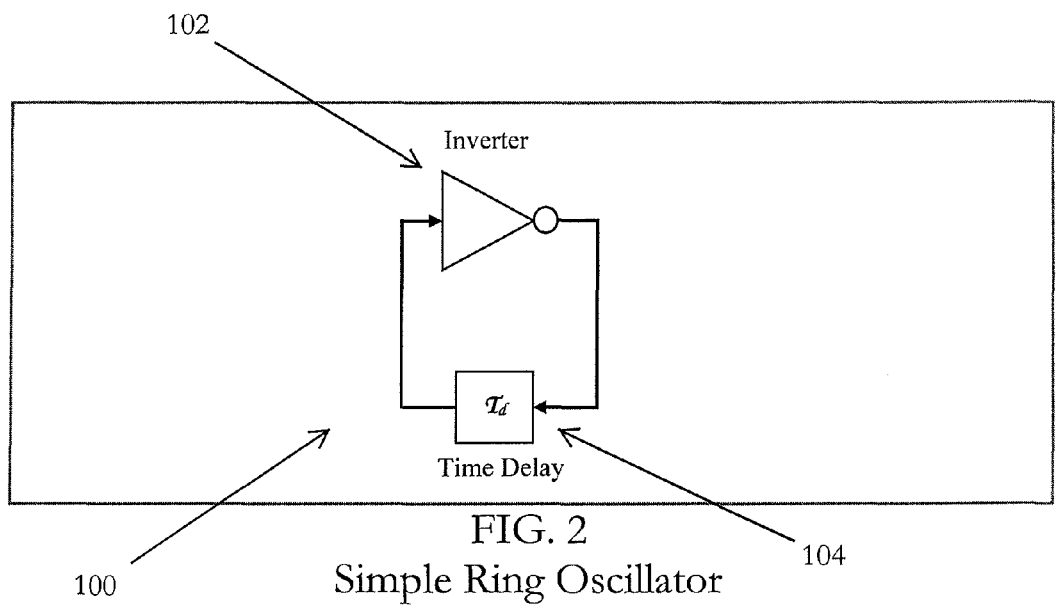
FIG. 2 is a schematic showing a ring oscillator.

As discussed in commonly owned and copending U.S. patent application Ser. No. 12/487,693, entitled "METHOD AND SYSTEM FOR DETECTION OF TAMPERING RELATED TO REVERSE ENGINEERING, filed Jun. 19, 2009, and U.S. Provisional Patent Application Ser. No. 61/329,315, entitled "METHOD AND SYSTEM FOR PROTECTING PRODUCTS AND TECHNOLOGY FROM INTEGRATED CIRCUITS WHICH HAVE BEEN SUBJECT TO TAMPERING, STRESSING AND REPLACEMENT AS WELL AS DETECTING INTEGRATED CIRCUITS THAT HAVE BEEN SUBJECTED TO TAMPERING", filed Apr. 29, 2010, which are incorporated herein by reference, the basic element of many unclonable functions is the ring oscillator (also referred to as an inverter feedback oscillator). A ring oscillator 100, in its simplest implementation, is a binary inverter 102 with some time delay 104 as shown in FIG. 2.

In accordance with the present invention, a ring oscillator is created within the inherent structure of a PLD using a multiplier integrated into the PLD (which generically results what is referred to herein as an arithmetic feedback oscillator or, in the case of a multiplier, a multiplier feedback oscillator). Through this implementation the system designer or user of the PLD is able to incorporate circuitry providing a digital "fingerprint" that may be used for confirmation that the proper PLD is actually being used. It is appreciated the underlying concepts of the present invention can be implemented after the manufacturing process is complete by using the programmable nature (and intention) of the PLD. In particular, and as will be discussed below in greater detail, by creating a arithmetic feedback oscillator within the structure of a PLD using a multiplier formed as part of the PLD, a predetermined, controlled oscillating signal is generated for identification of the PLD. This added circuitry does not affect the functionality of the PLD, but produces a signal only known to the system designer or user which may be used in identifying the counterfeit circuitry.

Figure 3:
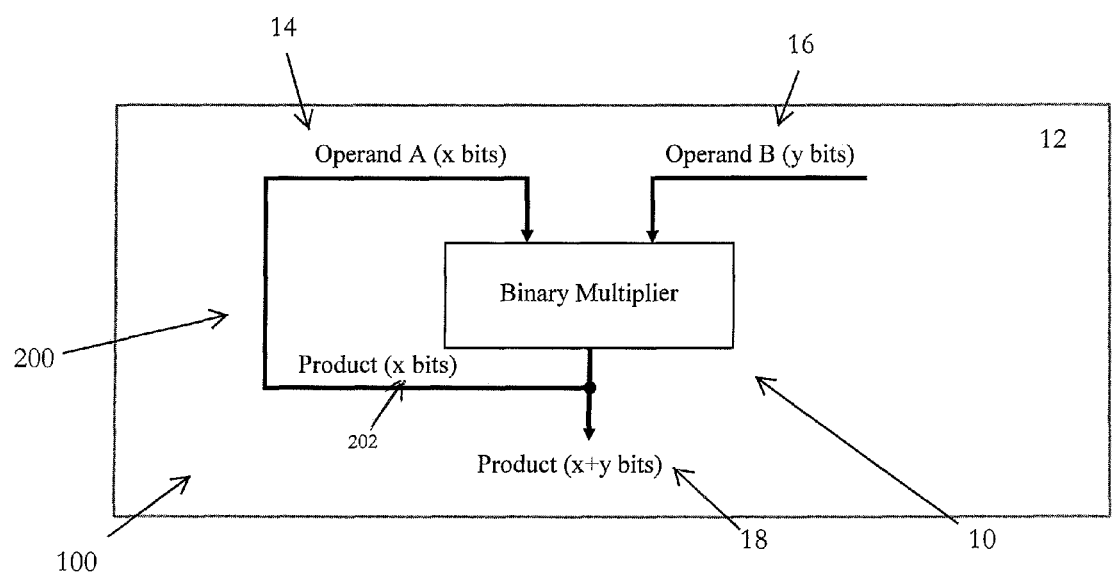
FIG. 3 is a schematic showing implementation of a ring oscillator using a binary multiplier (that is, a binary multiplier ring oscillator or multiplier oscillator or multiplier feedback oscillator) in accordance with the present invention.

Referring to FIG. 3, implementation of a ring oscillator (or a multiplier feedback oscillator as referred to herein) 100 using a multiplier 10 is achieved, in its most basic form, by incorporating a feedback loop 200 into the multiplier 10 and feeding the least significant product bits 202 back into one of the operand inputs, for example, Operand A 14, as shown in FIG. 3. The diagram shown in FIG. 3 is technically correct but requires some additional detail to ensure reliability and predictable operation.

Figure 4:
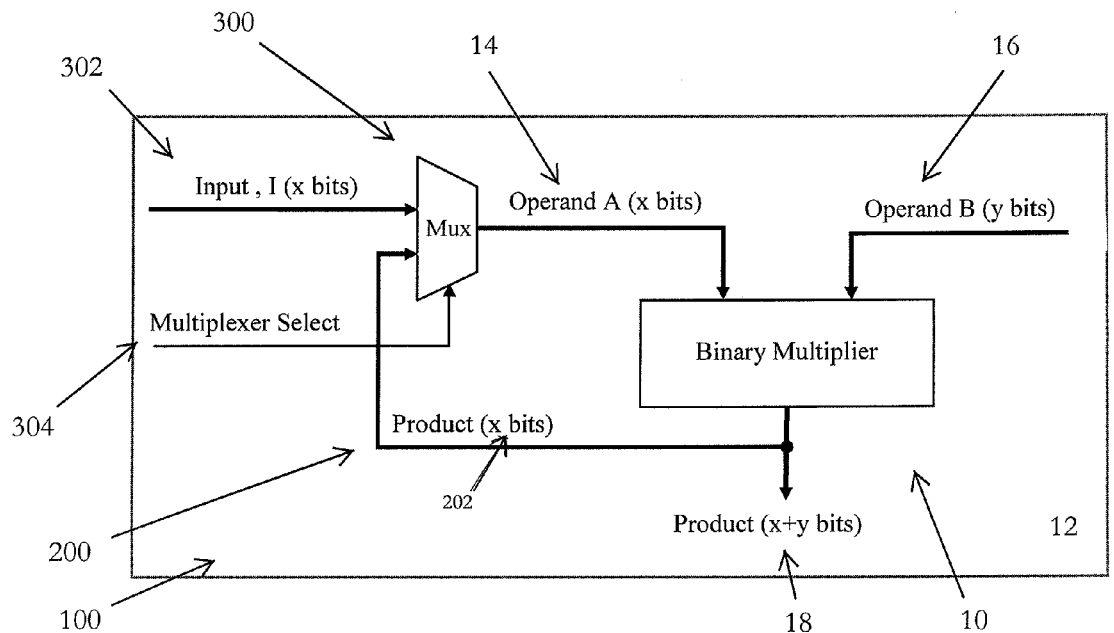
FIG. 4 is a binary multiplier feedback oscillator with a feedback multiplexer in accordance with the present invention.

In order to ensure oscillation, initial operand values must be selected that produce the desired effect (the details of which are discussed below) and a method of providing the appropriate initial values to both operand inputs is required. The provision of the initial inputs, that is, operand values that produce the desired output, is achieved by inserting a binary multiplexer 300 into the feedback loop 200 so that Operand A 14 may be input externally (via initial input conditions 302) or switched to receive the Product feedback (that is, the least significant product bits 202) provided by the feedback loop 200 (as shown in FIG. 4). The multiplexer 300 thereby provides an initial input 302 for initial conditions and provides additional delay so the multiplier feedback oscillator 100 implemented through the application of a multiplier (referred to below as a "multiplier feedback oscillator") is functional for the purposes of the present invention.

In order to force the multiplier oscillator 100 into oscillation, initial conditions must be selected that cause the output of the multiplier oscillator 100 to oscillate in a predictable manner. In accordance with a preferred embodiment of the present invention, two's complement signed multiplication is employed. It is appreciated the two's complement is a methodology for signifying negative integers in computer application, by encoding both positive and negative numbers in a binary number representation.

Although two's complement is disclosed for use in accordance with an embodiment of the present invention, two's complement is not required for operation of the present invention. The example illustrated in Table 1 (3×3) does not use two's complement. Almost any text on binary arithmetic includes two's complement notation. Two's complement multiplication is just like multiplication of signed integers in that the basic rule of (1) a negative number times a negative equals a positive number, (2) positive time positive equals positive, and (3) positive time negative equals negative. The only difference is how many digits change value. In signed integer, $(-1) \times (-1) = 1$. In 9-bit two's complement;

(1 1111 1111)×(1 1111 1111)=0 0000 0001.

In this manner, if the eight least significant bits of the product are fed back to the eight least significant bits of one operand and the most significant product bit is fed back to the most significant bit of the same operand, a number of oscillating bits are produced in parallel. This positive to negative inversion process is a powerful tool for this test.

It is appreciated the multiplication of two negative numbers produces a positive number. Negative one (−1) multiplied by itself produces positive one. If Operand B is set to −1 and Input I, is set to −1, the product becomes positive one (+1). In two's complement notation, −1 is a represented by all ones (that is, 1,1111,1111 for a 9-bit example) and +1 is a single 1 in the least significant location with all other bits set to 0 (that is, 0,0000,0001 for the 9-bit case).

Figure 7:
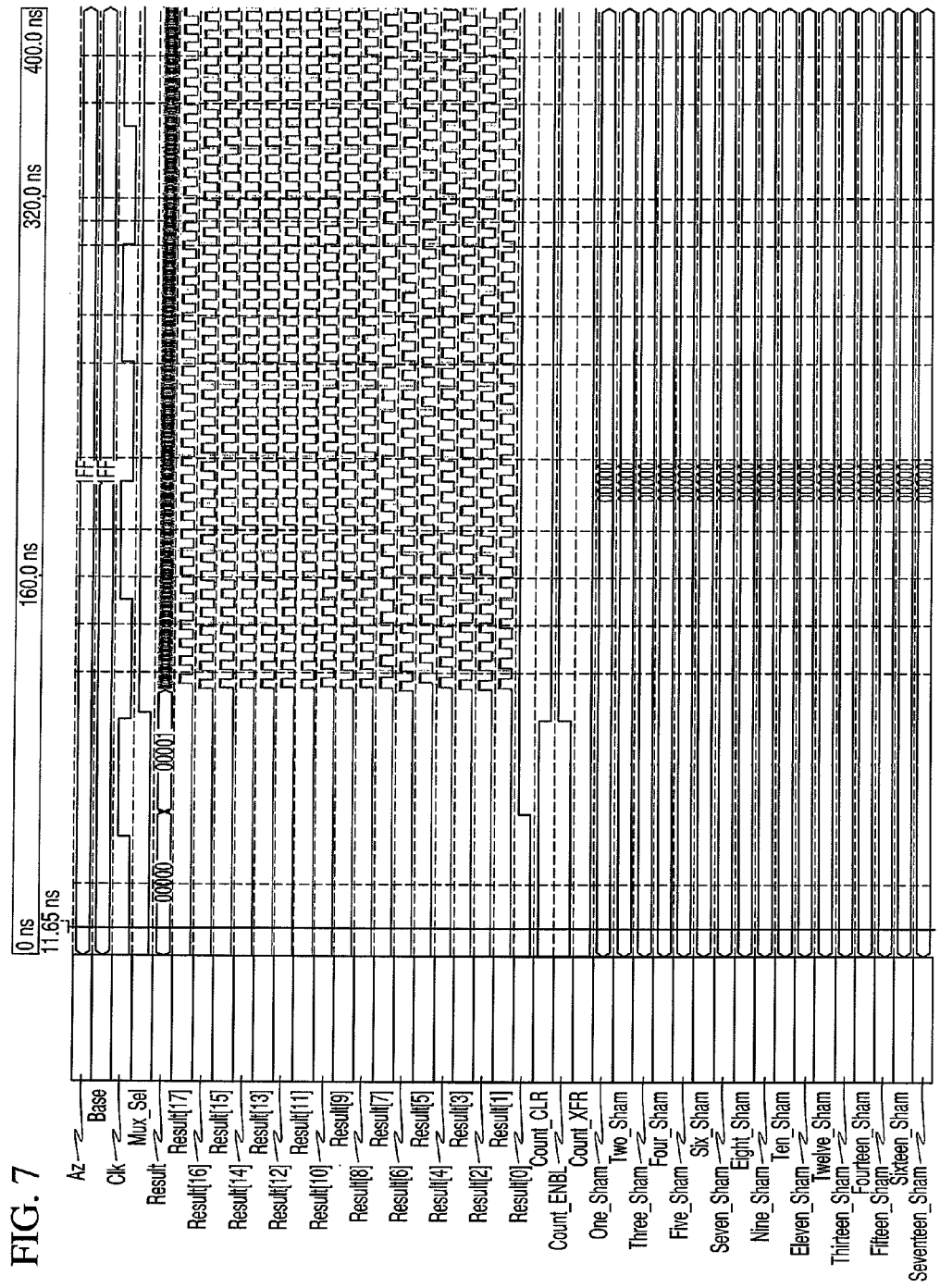

Referring to FIG. 4, and in accordance with an exemplary embodiment, the system initial conditions are set by setting Operand B 16 to −1 and Input I 302 to −1 and using the multiplexer select 304 to pass Input I 302 to Operand A 14 of the multiplier oscillator 100. After the product output 18 is stable, the multiplexer select 304 is changed to provide feedback (that is, the least significant product bits 202) via the feedback loop 200 from the multiplier result (product) 18 back to Operand A 14 resulting in an oscillating system. This set of initial conditions works, producing an oscillation but producing only limited information about the specific multiplier feedback oscillator 100 circuit. FIG. 7 show the waveform produced by a −1×−1 multiplication. The two inputs are −1 (hexadecimal 1FF) and produce an output of 1 (hexadecimal 001) until the multiplexor select signal ("Mux_Sel") changes from zero (low) to one (high), at which point the system begins oscillation on every output bit except bit 0 providing good inputs for the "Sham" (or evaluation) counters in the form of binary counters as described below in greater detail.

A larger set of initial conditions is derived by understanding the operation of multipliers. In all multipliers (binary or other counting systems) each bit is a function of the lesser order bits (that is, bits representing smaller values of the resulting product) but no bit is a function of higher order bits (that is, bits representing higher values of the resulting product). That mathematical fact is used in accordance with the present invention to produce pairs of numbers that generate a circular pattern of results.

Observe the pattern of multiplying the value three (3) by itself and then by the succeeding results. Table 1 illustrates this process by showing the decimal results and the 8 least significant bits of binary result (Least Significant Byte, LSB).

TABLE 1

Multiplication Examples with Repeating Characteristics

| Operand A | Operand B | Decimal Result | Binary Result Least Significant Byte | Least Significant Hexadecimal Digit |
|---|---|---|---|---|
| 3 | 3 | 9 | 0000, 1001 | 9 |
| 3 | 9 | 27 | 0001, 1011 | B |
| 3 | 27 | 81 | 0101, 0001 | 1 |
| 3 | 81 | 243 | 1111, 0011 | 3 |
| 3 | 243 | 729 | 1101, 1001 | 9 |
| 3 | 729 | 2,187 | 1000, 1011 | B |
| 3 | 2,187 | 6,561 | 1010, 0001 | 1 |
| 3 | 6,561 | 19,683 | 1110, 0011 | 3 |
| 3 | 19,683 | 59,049 | 1010, 1001 | 9 |
| 3 | 59,049 | 177,147 | 1111, 1011 | B |

It is appreciated with reference to the example provided in Table 1, the last digit in the decimal result repeats in a pattern of 9, 7, 1, 3. Similarly, in the binary example the least significant hexadecimal digit repeats in a hexadecimal pattern of 1, 3, 9, B. The least significant binary bit is always a 1 (multiplying two odd numbers always produces an odd result) and the second binary bit (representing 2) oscillates between a zero and a 1.

This repeating pattern always works (for the appropriate inputs) because the least significant bits are purely a function of the low order inputs with no regard to the higher order bits. Consider a situation where Operand A, as represented in binary form, is $A_n \ldots A_3 A_2 A_1 A_0$, Operand B, as represented in binary form, is $B_n \ldots B_3 B_2 B_1 B_0$, the product, as represented in binary form, is $P_{2n} \ldots P_3 P_2 P_1 P_0$, the zeroth product bit ($P_0$) is purely a function of the zeroth bit of the operands ($A_0$ and $B_0$): $P_0 = A_0$ AND $B_0$. The $1^{st}$ product bit ($P_1$) is purely a function of the zeroth and $1^{st}$ of the operand bits ($A_0, A_1, B_0,$ and $B_1$): $P_1 = (A_0 B_1)$ XOR $(A_1 B_0)$. There is no information in the $P_0$ and $P_1$ bits about the state of the higher order input bits so one can actually say that the lower order bits don't know and don't care about the information in the higher order bits. This fact allows the information in the higher order bits to be discarded or truncated and the lower order multiplication still continues in the same manner. Higher order information is discussed later.

In accordance with the implementation of the present system, oscillation immediately begins on the second binary bit (two value or $P_1$ with reference to the example present above) when the multiplier oscillator 100 is set with initial conditions Operand A=3 and Operand B=3 and the multiplexer 300 is switched into feedback mode after the multiplier 10 outputs the initial result of 9. The multiplier 10 may be of any input bit width greater than or equal to 2 and the oscillation will occur. For larger multipliers (wider bit width), the higher order bits actually become "noisy" since the multiplier 10 is constantly changing state before the outputs can settle. (These noisy bits still create a consistent pattern that is recorded by the evaluation counters or may be analyzed using some other method.)

Other positive number sets that produce specific oscillations are decimal 5, 9, 17, 33, 65, 127, and 257 which equate to binary 101, 1001, 10001, 100001, 1000001, and 10000001 respectively. These sets produce useful oscillations in the following manner: 5×5 produces oscillation on the $P_2$ output; 9×9 produces oscillation on the $P_3$ out put; 17×17 produces oscillation on the $P_4$ output and so on. In each of these cases the bits of lower order (than the oscillation point) remain zeros except for the zeroth bit which remains logical one. These number sets allow individual characterization of each multiplier output.

Further, any initial condition set that includes (1) at least one odd number, or (2) two negative numbers results in an oscillation result.

There are a large number of interesting initial values that produce different oscillation effects. In order to maintain a repeating pattern, at least one term must be an odd number. It is appreciated using even number multiplicands is anticipated and does yield some useful results, but the transient operation of the multiplier feedback oscillator terminates after a predetermined number of operations unless the transients are perpetuated by logic glitches. In the case of the multiplier with feed back as shown in FIG. 4, Operand B must be an odd number.

Another useful technique is setting the initial conditions to −1 in two's complement and allowing all of the output bits to oscillate. In this case, the bits do not all oscillate together, but loose synchronization due to propagation delays in deriving each term. The oscillation frequency (and the relationship among the frequencies) of each output bit is unique based on the manufacturing tolerances of the silicon.

Figure 10:
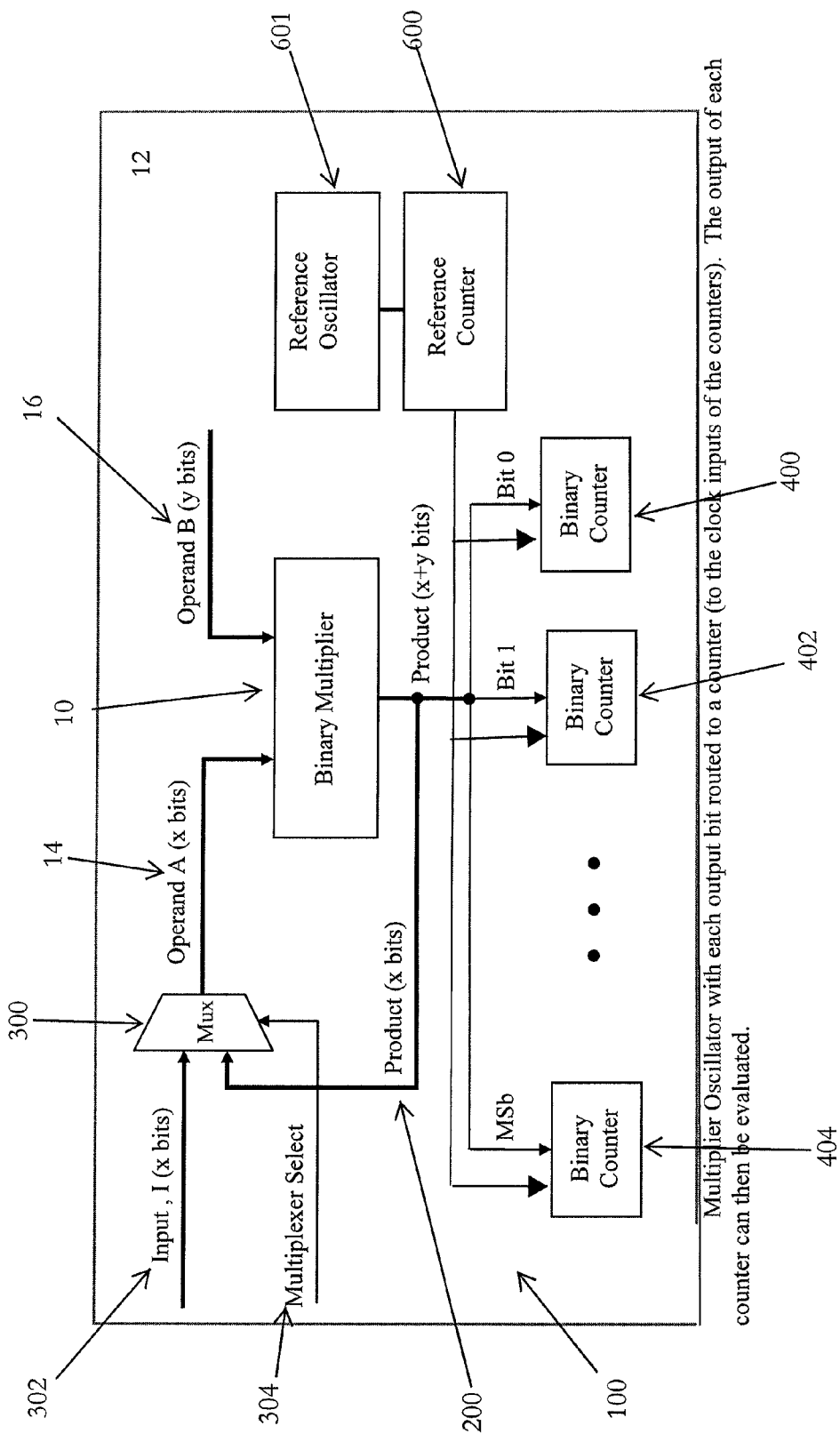
FIG. 10 is a schematic of the multiplier feedback oscillator shown with reference to FIG. 4 including binary counters.

Referring to FIG. 10, the system disclosed with reference to FIG. 4 is improved through the addition of binary counters (that is, Sham or evaluation counters) 400, 402, 404. In particular, the multiplier oscillator 100 is provided with binary counters 400, 402, 404 monitoring the various output bits of the multiplier oscillator 100. The outputs of the binary counters 400, 402, 404 may then be evaluated for the purpose of evaluating the resulting patterns.

In accordance with the embodiment disclosed with reference to FIG. 10, the clock input of the first binary counter 400 receives the output bits generated as the zeroth bit product of the multiplier oscillator 100, the clock input of the second binary counter 402 receives the output bits generated as the 1$^{st}$ bit product of the multiplier oscillator 100, and so on until the clock input of the M binary counter 404 receives the output bits generated as the M−1 bit product of the multiplier oscillator 100. The received output bits are monitored and evaluated in accordance with the principles of the invention discussed herein.

In accordance with this embodiment, the binary counters 400, 402, 404 receiving distinct output bits of the multiplier oscillator 100 are used in the evaluation of the frequency of change of the output bits of the multiplier oscillator 100. A reference counter 600 associated with each of the binary counters 400, 402, 404 produces a time interval over which the binary counters 400, 402, 404 of the output bit are allowed to operate (or to count over a frequency).

More particularly, a reference oscillator 601 drives a binary counter referred to as the reference counter 600. The reference counter 600 is used to measure a specific interval of time (or a time reference) for the purpose of monitoring count rate of the binary counters 400, 402, 404, which is ultimately used to determine whether the integrate circuit at issue is what it purports to be. When the specific interval of time has elapsed, the reference counter 600 generates control signals for the binary counters 400, 402, 404. These control signals cause the following events to occur: (1) the binary counters 400, 402, 404 are temporarily disabled (that is, the binary counters 400, 402, 404 stops counting), (2) the data value (that is, the count value generated by the binary counters 400, 402, 404) is transferred to a register via the signal bus, and (3) the binary counters 400, 402, 404 are cleared (zeroed) and allowed to restart their counting process. The time interval is set sufficiently long enough that changes in the count value generated by the binary counters 400, 402, 404 are detectable and significant. One millisecond is a sufficient time interval for some applications. Longer or shorter increments may be applicable in other applications.

Referring to FIG. 11, the system disclosed with reference to FIG. 4 is improved through the addition of an output register 500 for data evaluation. The register 500 is connected to the outputs of the multiplier oscillator 100 and monitors a time interval generated by a clock or a binary counter to control the rate at which data is latched into the register described. As discussed above with regard to the binary counters 400, 402, 404, a reference counter 602 and reference oscillator 603 are employed with the output register 500 for controlling the time periods for latching data.

In addition, it is appreciated the data produced by the multiplier oscillator is random since each part of the multiplier oscillator is operating based on the intrinsic delays inherent in the implementation of the present multiplier oscillator. The rate of the change of the output of the multiplier oscillator is also random. Sampling this random data at a regular rate, therefore, produces a random output and the present multiplier oscillator may be used as a random number generator. Through the use of the multiplier oscillator as a random number generator keys for encryption processes are available. This furthers the challenge of those wishing to cause harm as discussed below.

Figure 12:
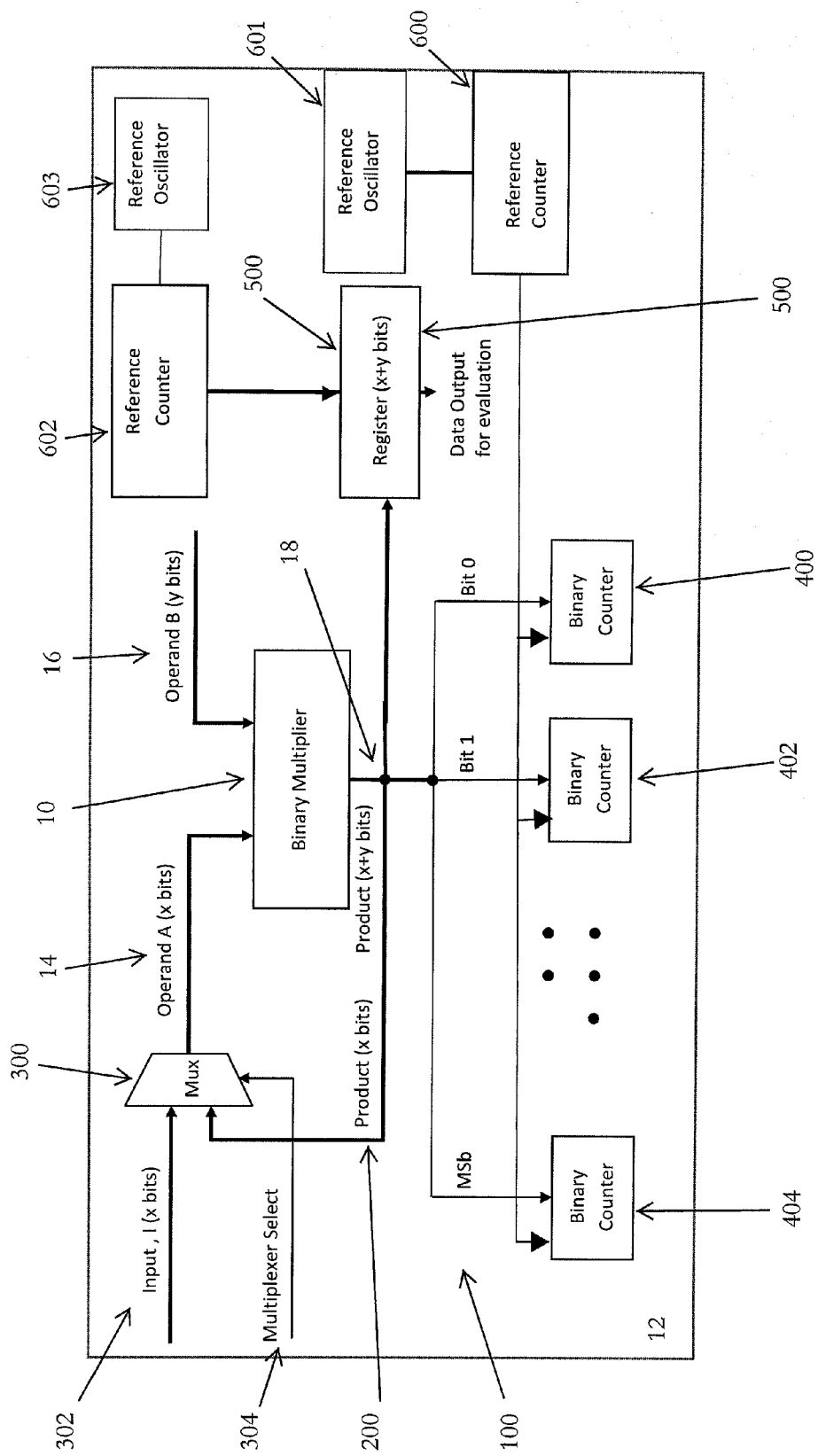
FIG. 12 is a schematic of the multiplier feedback oscillator shown with reference to FIG. 4 including binary counters and an output register for data evaluation.

Referring to FIG. 12, the output register 500 and the binary counters 400, 402, 404 may be employed in a single system enhancing the operational efficiency thereof. In accordance with such an embodiment, the output register 500 and the binary counters 400, 402, 404 are simultaneously linked to the output pins of the multiplier oscillator and function in the same manner as described above. As such, similar reference numerals are used in the disclosure of FIG. 12. As with the embodiments shown in FIGS. 10 and 11, reference counters 600, 602 and reference oscillators 601, 603 are employed in control time periods. While distinct reference counters and reference oscillators are disclosed in the embodiment shown in FIG. 12, a single reference counter/reference oscillator could be linked to both the output register and binary counters.

Figure 5:
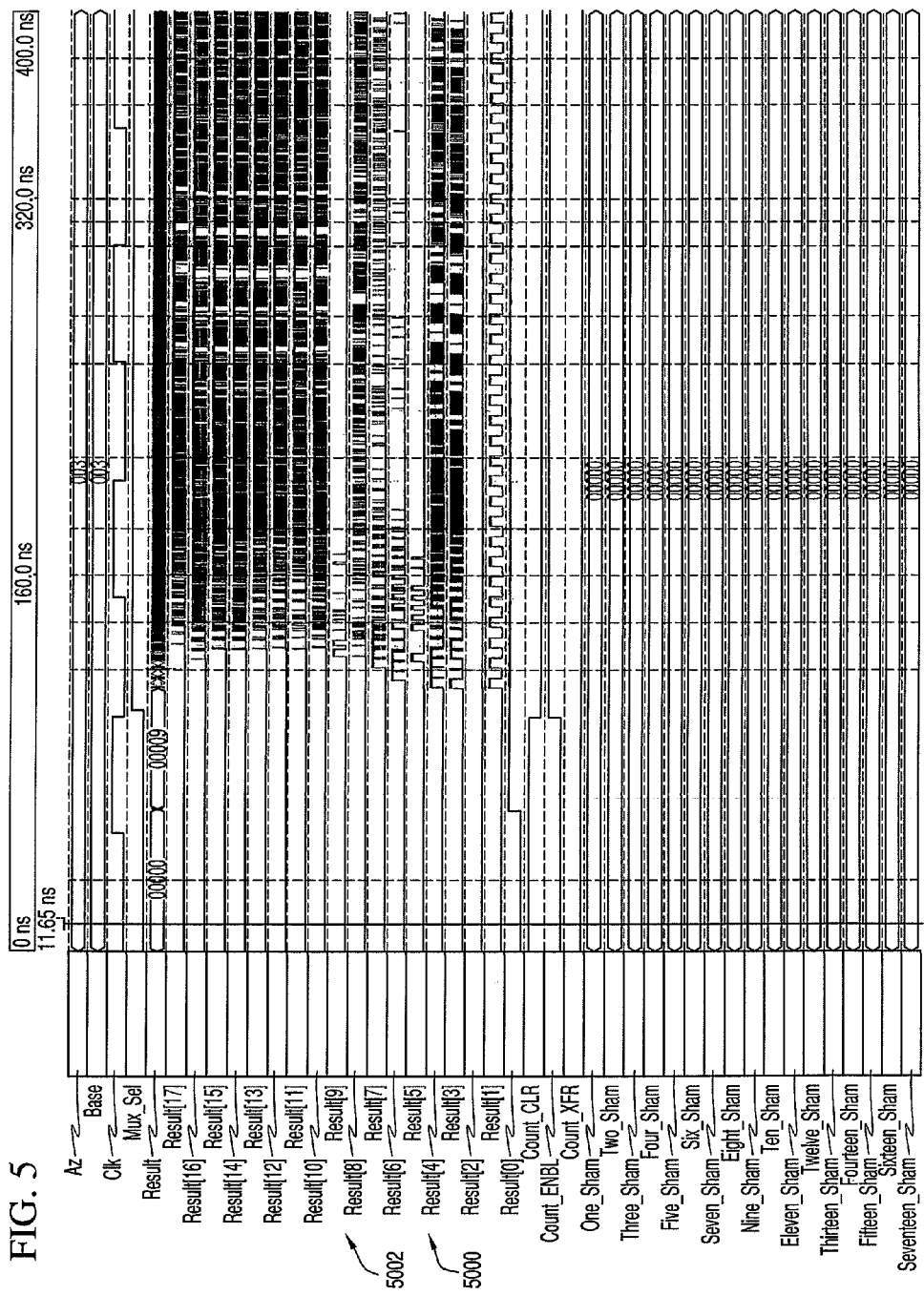
FIGS. 5, 6 and 7 are graphical representations of results generated through the implementation of the present invention.

Referring to FIGS. 5 to 9, the basic feedback multiplier oscillator 100 in accordance with the present invention is incorporated into a system capable of setting various inputs and the bit results are evaluated. Referring to FIG. 5, the beginning oscillation on the Result[1] output pin (that would be $P_1$, in the example presented above) is shown with reference numeral "5000". The input registers are both set to 3 and the output stabilizes at 9 (just after the first rising edge on the Clk signal which loaded the input registers). The $Mux_{13}$ Sel signal is changed to 1 and the multiplier output starts oscillating on output Result[1] (designated by reference numeral "5000") while the other outputs (that is, the outputs for the higher order bits of the product; see Result[2] to Result[17] positioned directly above Result[[1] and designated by reference numeral "5002")) start producing noise outputs.

Figure 6:
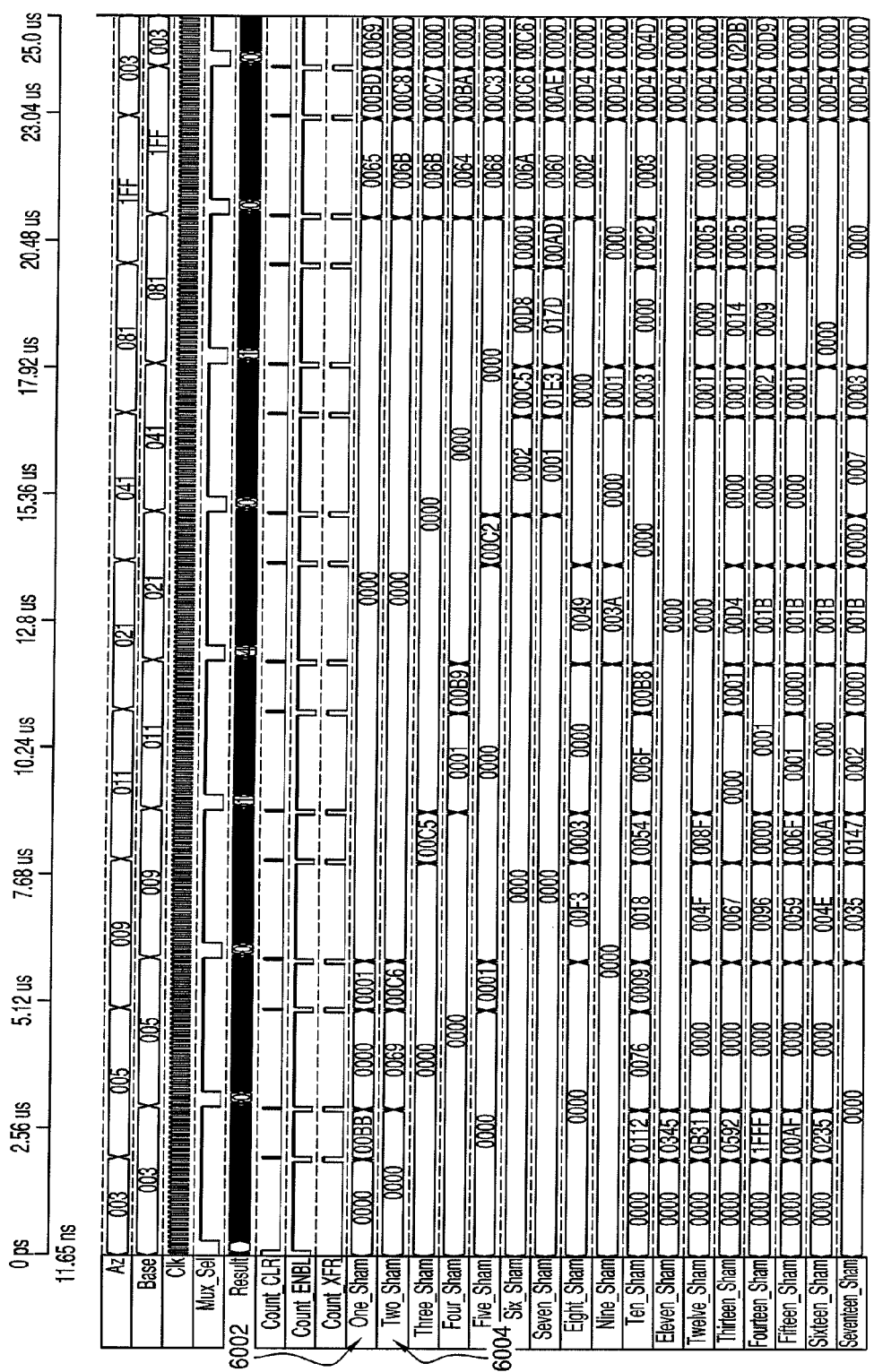

Referring now to FIG. 6, a zoomed out version of simulation with numerous "Sham" outputs, that is, the outputs of the evaluation counter, is shown. Each Sham value is the results of a binary counter operating on a respective Result bit (One_Sham counter counts the oscillations on Result[1] (see reference numeral "6002"), $Two_{13}$ Sham counter counts Result[2] (see reference numeral "6004") and so on). This simulation is of an 18-bit output Multiplier with two 9-bit inputs (also referred to as a 9×9 multiplier). The lower 9 bits are primarily a function of the input values as discussed earlier. The 9 higher bits are based on the carry of the 9 lower bits.

Notice that the "lower order" bits usually only get a valid count on the bit of interest (Result[1] for 3×3, Result[2] for 5×5, Result[3] for 9×9 and so on). The upper ("higher order") bits are interesting in that there are valid counts for many cycles when only the lower bit of interest operated. This behavior of the Sham value related to the higher order bits provides more information to characterize the multiplier. All of the Sham values will be different from integrated circuit to integrated circuit based on tolerances in the silicon manufacturing process.

Referring now to FIG. 7, the beginning of oscillation for a "−1" times "−1" multiplication is shown. All ones (hexadecimal 1FF) equates to "−1" in two's complement format. Notice that all the bits oscillate, but they are out of phase with each other and obviously start to diverge in frequency (rate) early in the simulation. In FIG. 6 the result of this divergence is evident in the data at about time 23µ seconds. Remember, these values are simulation and will actually be slightly different for each integrated circuit.

Figure 8:
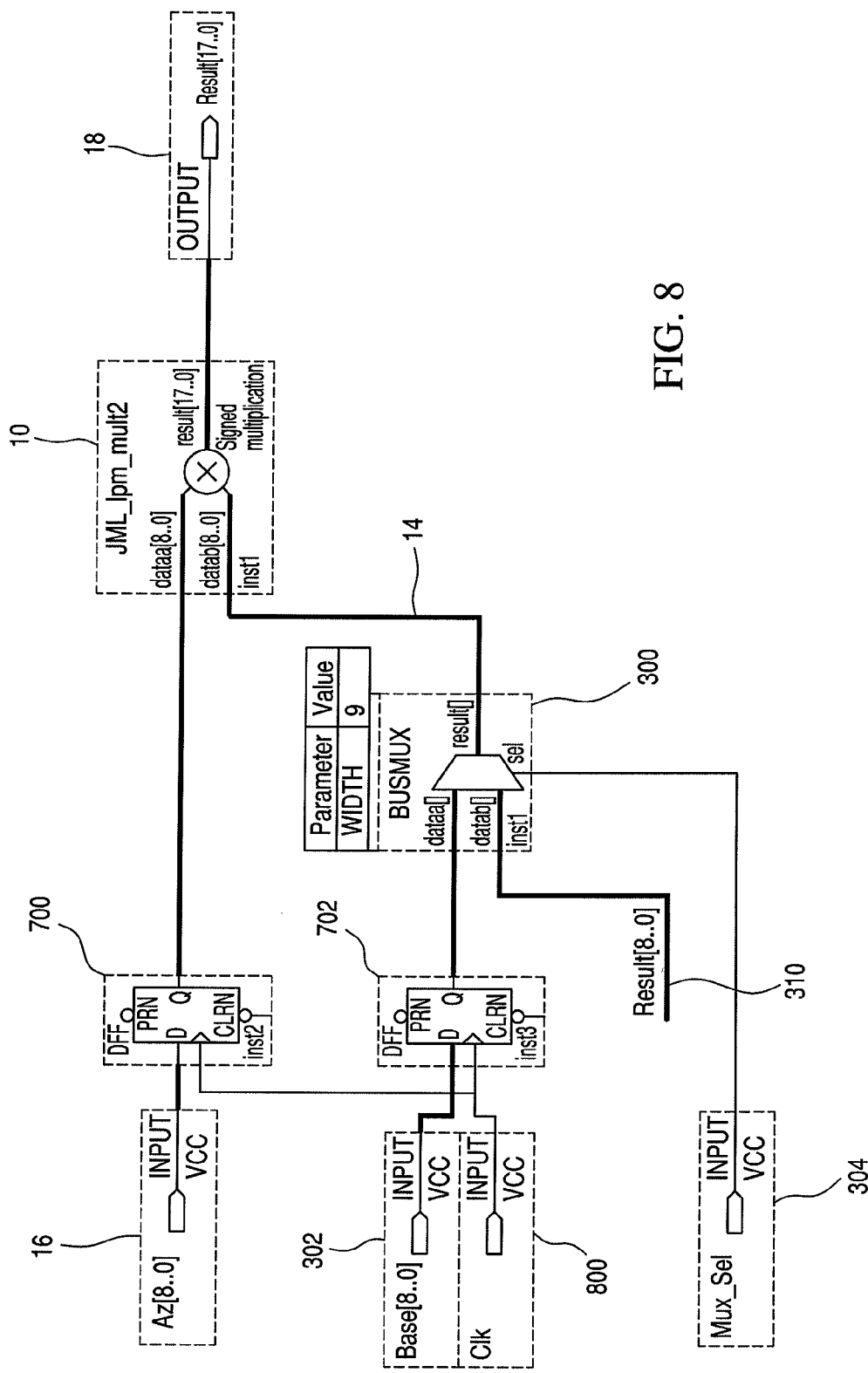
FIG. 8 is a schematic showing an implementation of the present invention with input registers and a feedback multiplexer.

FIG. 8 shows an implementation with input registers 700, 702 for Input I 302 and Operand B 16 and a feedback multiplexer 300. This is the actual implementation used in the referenced simulations and includes a clock 800 linked to both input registers 700, 702. Notice that only output bits Result[8 . . . 0] 310 are fed back into the multiplexer. This is necessary since the number of output bits equals the sum of the number of input bits. As demonstrated in the earlier discussion, only a few of the least significant bits have to be fed back in order to achieve oscillation. Feeding back the maximum number of output bits allows for testing with the most possible input patterns. Testing with the most patterns provides the most information about the multiplier and allows the use of different tests to challenge an adversary.

This implementation may be set up to allow setting all the input registers from a single data bus.

Figure 9:
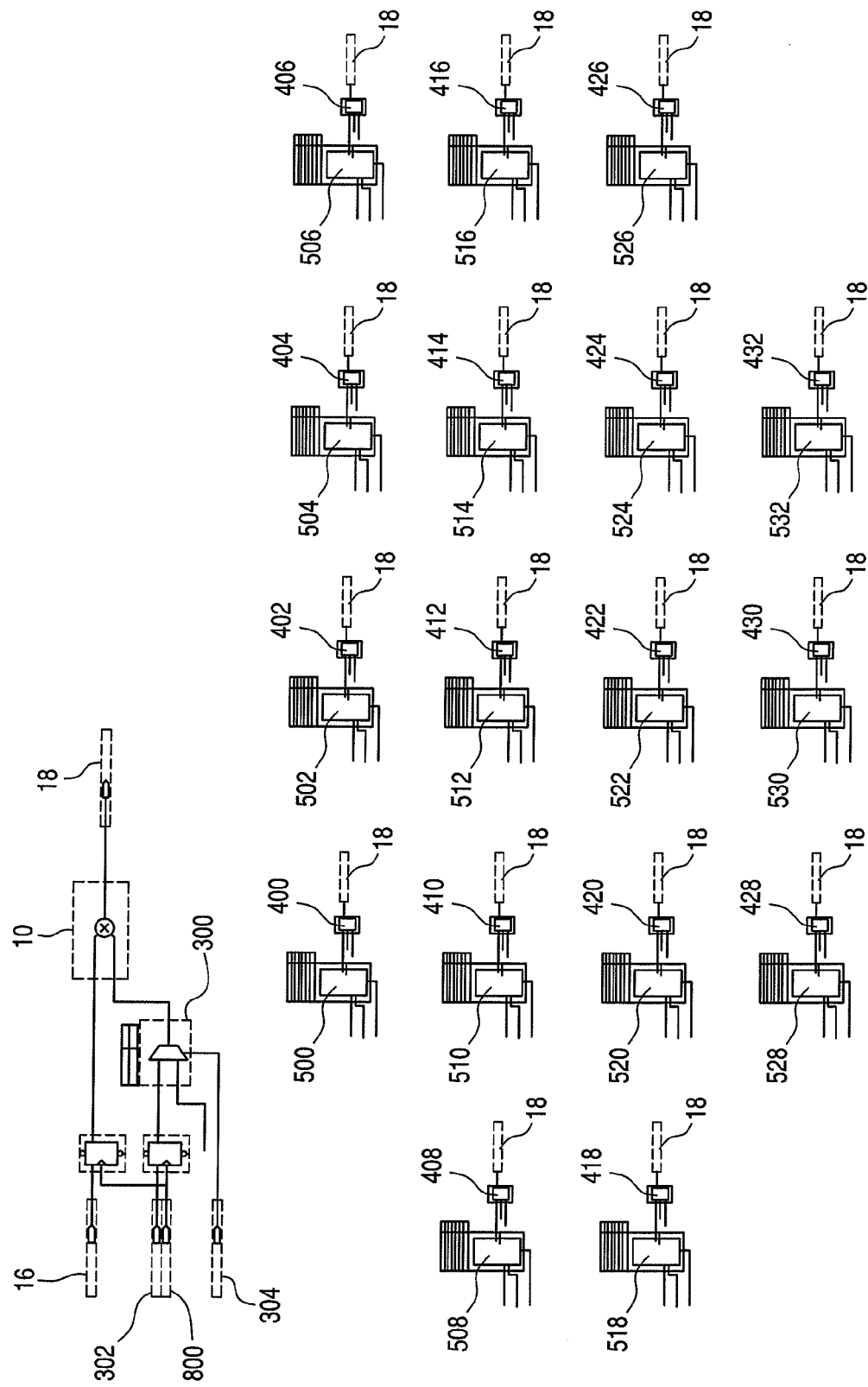
FIG. 9 is a schematic showing the implementation of the "Sham" (or evaluation) counters and registers to store the output count values.

FIG. 9 shows the implementation of the binary counters 400-432 and registers 500-532 to store the output count values. The mechanism to control the loading of the input registers 700, 702 the control of the feedback multiplexer 300, and the control of the enable and transfer signals for the binary counters 400-432 and Sham (or evaluation) registers in the form of output registers 500-532 is not shown. In a large system, a number of multiplier oscillators 100 would binary counters 400-432 and output registers 500-532 and only one multiplier oscillator 100 would be allowed to oscillate at a time from the group sharing registers.

The potential for someone to reverse engineer the multiplier oscillator and reproduce the "fingerprint" is highly unlikely. The numeric values loaded into the registers (shown in FIG. 8 and identified as Input I and Operand B in FIG. 4) are used to generate a specific oscillation pattern and are known as the challenge. In one example the challenge values are "3" and "3", while in another example in this application the challenge values are both "−1". The numeric values returned by the output of the evaluation counters is referred to as the response. It can be shown that each valid challenge set produces a unique response for each multiplier feedback oscillator implemented. In fact, it has been found the only value that will not create oscillations required in accordance with the present invention is "0". 9-bit by 9-bit and 18-bit by 18-bit multipliers are common. For a single multiplier feedback oscillator with 9-bit inputs there exist over 131,000 unique challenges each with up to 256 bits of response and over 4 billion possible output combinations. In many FPGAs there are 100's of multipliers that can be used for unclonable functions thereby greatly increasing the complexity of the authentication system. Consequently, the likelihood one would be capable of reverse engineering a multiplier oscillator employed in accordance with the present invention highly unlikely.

In order to reproduce the fingerprint a counterfeiter must know all of the responses for all of the challenges. An identification system based on 16 multipliers with 9-bit inputs provides $2^{256}$ possible valid combinations, each with a 256-bit response. A counterfeiter must be able to either predict the challenge response set that will be tested, or must know every challenge response combination. The time required to derive every combination and the data storage required to maintain the information are both prohibitively large.

The multiplier feedback oscillators also operate slightly differently each time a challenge is processed (variance). If the variance of this operation is characterized and understood, a counterfeit with no variance or incorrect variance is also detected.

For authentication, the master system needs to keep a database of a few key values, much like an encryption key. If the authentication system keeps results on a few challenge response sets and encrypts the challenge response process, the counterfeiting challenge becomes even greater. Each time an authentication is required, the authentication system can randomly select one of some number of stored challenge/response sets and encrypt the exchange process. In this manner, an adversary must defeat the encryption system and capture all of the stored challenge response sets in order to falsify the authentication process. Since a system with 100's of multipliers is possible, the counterfeiting challenge is even greater.

As discussed above, the present invention provides for a family of arithmetic feedback oscillators allowing for the authentication and identification of Programmable Logic Devices (PLD) such as Field Programmable Gate Arrays (FPGA) and Application Specific Integrated Circuits (ASIC). The arithmetic feedback oscillators also provide a method for designing a processor with built in authentication capabilities. In the same manner that a binary multiplier circuit may be used to implement an inverter function, so may an arithmetic adder or an arithmetic divider be used to implement an inverter function.

Figure 13:
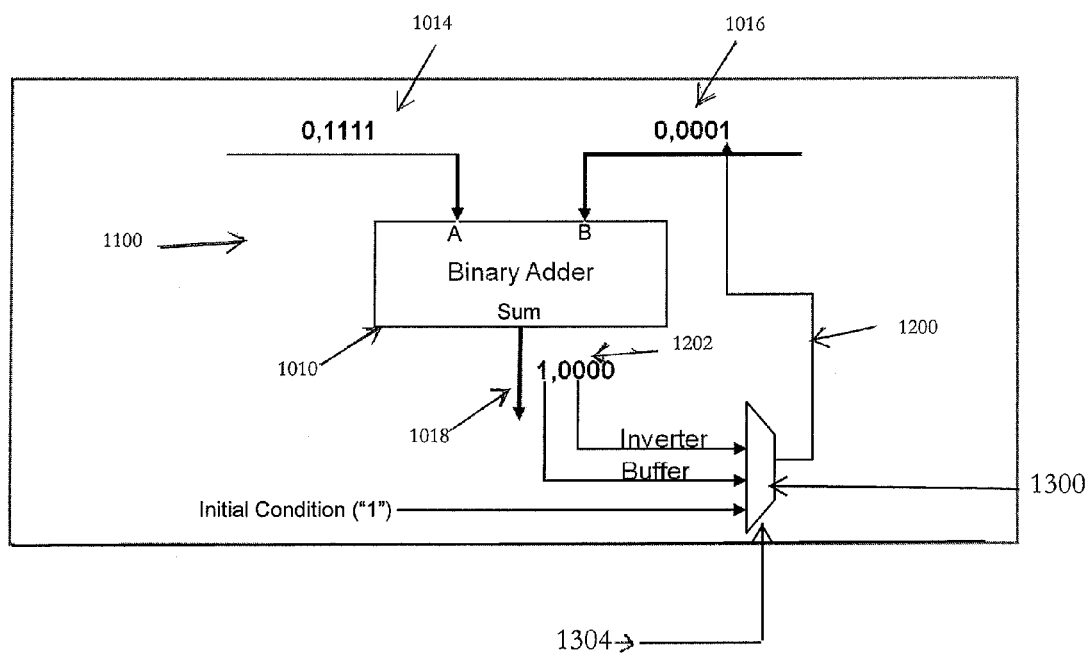
FIG. 13 is a schematic of a arithmetic feedback oscillator implemented using a binary adder (that is, an adder feedback oscillator) in accordance with the present invention.

FIG. 13 shows a binary adder 1010 configured as an inverter and implemented into a ring oscillator (referred to herein as "adder feedback oscillator") 1100 in accordance with the present invention. The binary adder 1010 contains 2 5-bit input operands, Operand A 1014 and Operand B 1016, which are mathematically added to each other to produce the Sum 1018 output by the binary adder 1010. For this example, the numbers 15 (binary 0,1111) and 1 (binary 0,0001) are selected for Operand A 1014 and Operand B 1016 so that a carry operation produces a sum output 1018 of 16 (binary 1,0000). A feedback loop 1200 is implemented using a multiplexer 1300 that returns the value of one of the output bits 1202 of the sum output 1018 to the least significant input bit of one operand input to the binary adder. In the case of the embodiment shown in FIG. 13, the one output bit 1202 is supplied via the return to the least significant input bit of the Operand B 1016. As shown with reference to FIG. 13, if an output bit equal to zero is multiplexed back to the input bit 1016 based upon the multiplexer select 1304 of the multiplexer 1300 (the signal labeled "Inverter") the system operates as a ring oscillator. If, however, a delay in the oscillation of the system is desired, the multiplexer select 1304 may be designated to transmit, via the multiplexer 1300, an output bit equal to one back to the least significant input bit of the operand input bit 1016. Such an operation would maintain the input bit 1016 in its initial input condition and delay oscillation of the system.

Figure 14:
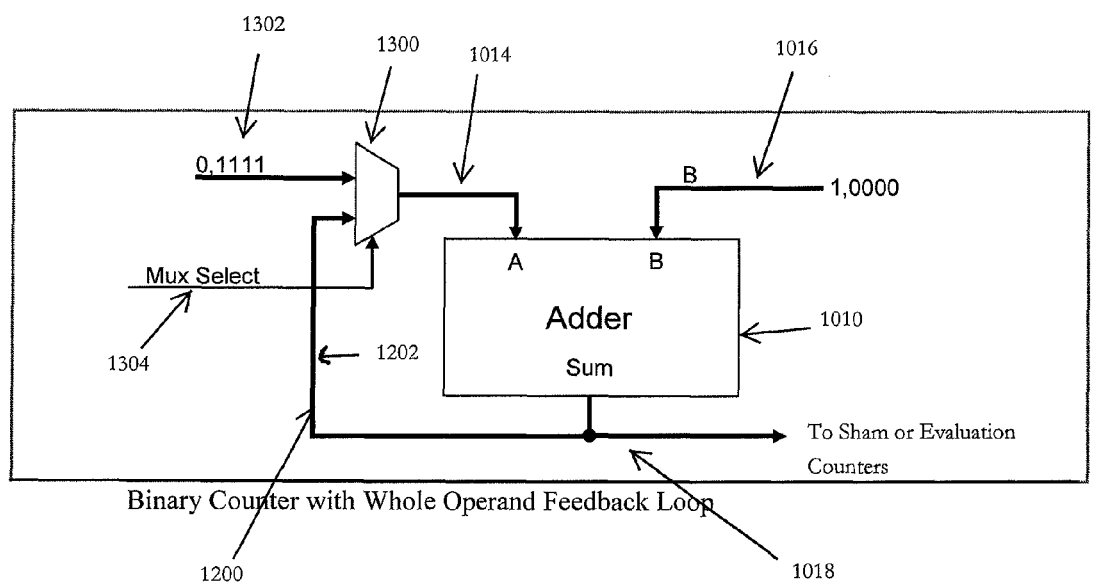
FIG. 14 is a schematic of an adder feedback oscillator in accordance with the present invention.

Note that 16 (1,0000 in unsigned binary) is the inverse of 15 (0,1111 in unsigned binary) when the initial Operand A & B input values of 15 and 1 are used in accordance with the disclosed exemplary embodiment. From this aspect, and with reference to an alternate embodiment as shown with reference to FIG. 14, the feedback loop 1200 of the adder feedback oscillator 110 may loop back to the binary adder 1010 the entire Sum output 1018 (that is, the whole operand) of the output of the binary adder 1010. In this mode, the binary adder 1010 operates as multiple inverters in a similar manner to the multiplier version described above with the multiplexer 1300 supplying the Operand A 1014 input with the initial input 1302 from an external source and the multiplexer select 1304 switching to provide Operand A 1014 input of the binary adder 1010 with the output bits 1202, that is, the sum output 1018 of the output, via the feedback loop 1200. Each bit of the Sum output 1018 of the binary adder 1010 oscillates at a different frequency and the oscillations are not regular due to the combinational delays of the binary adder 1010 circuitry. Additionally, there are numerous initial values (numerical terms applied to the inputs of Operand A 1014 and Operand B 1016) that result in different oscillation characteristics.

As with the multiplier feedback oscillator 100 as described above with reference to FIGS. 1 through 12, the outputs 1018 of the adder feedback oscillator 1100 may be evaluated by binary counters as disclosed with reference to FIGS. 9 through 12 in order to determine the unique identity of the circuit.

Figure 15:
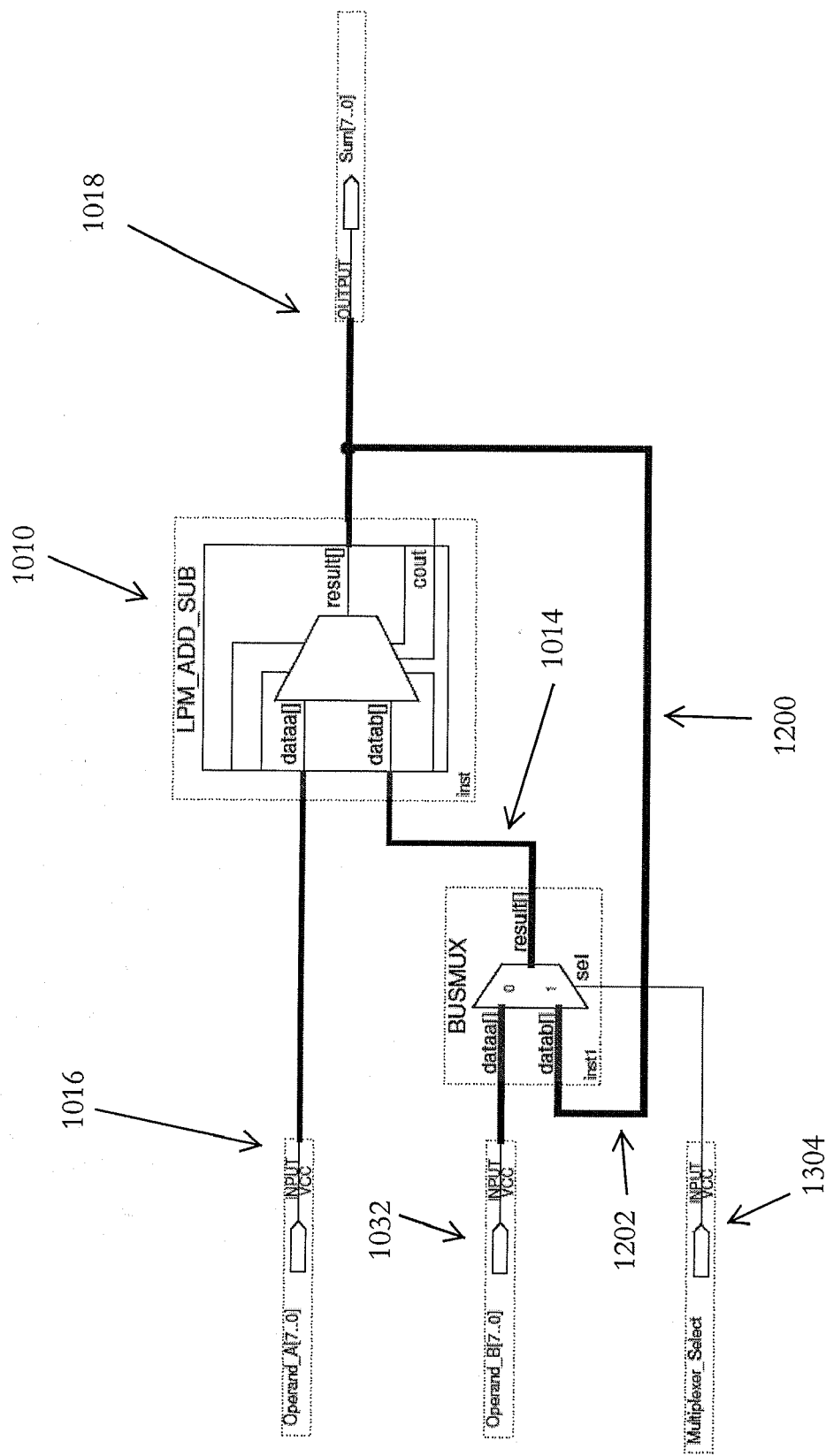
FIG. 15 is a schematic of an implementation of an adder feedback oscillator in accordance with the present invention.

FIG. 15 shows the actual circuit implementation of an exemplary adder feedback oscillator 1100 in accordance with this embodiment. As shown in FIG. 15, the adder feedback oscillator 1100 includes a standard binary adder 1010 and a multiplexer 1300. The multiplexer 1300 allows the control system to select, via the multiplexer select 1304, one of the adder inputs, that is, Operand A 1014, from either an external input 1302 or the whole operand output bits 1202 based upon feedback of the adder sum output 1018.

Figure 16:
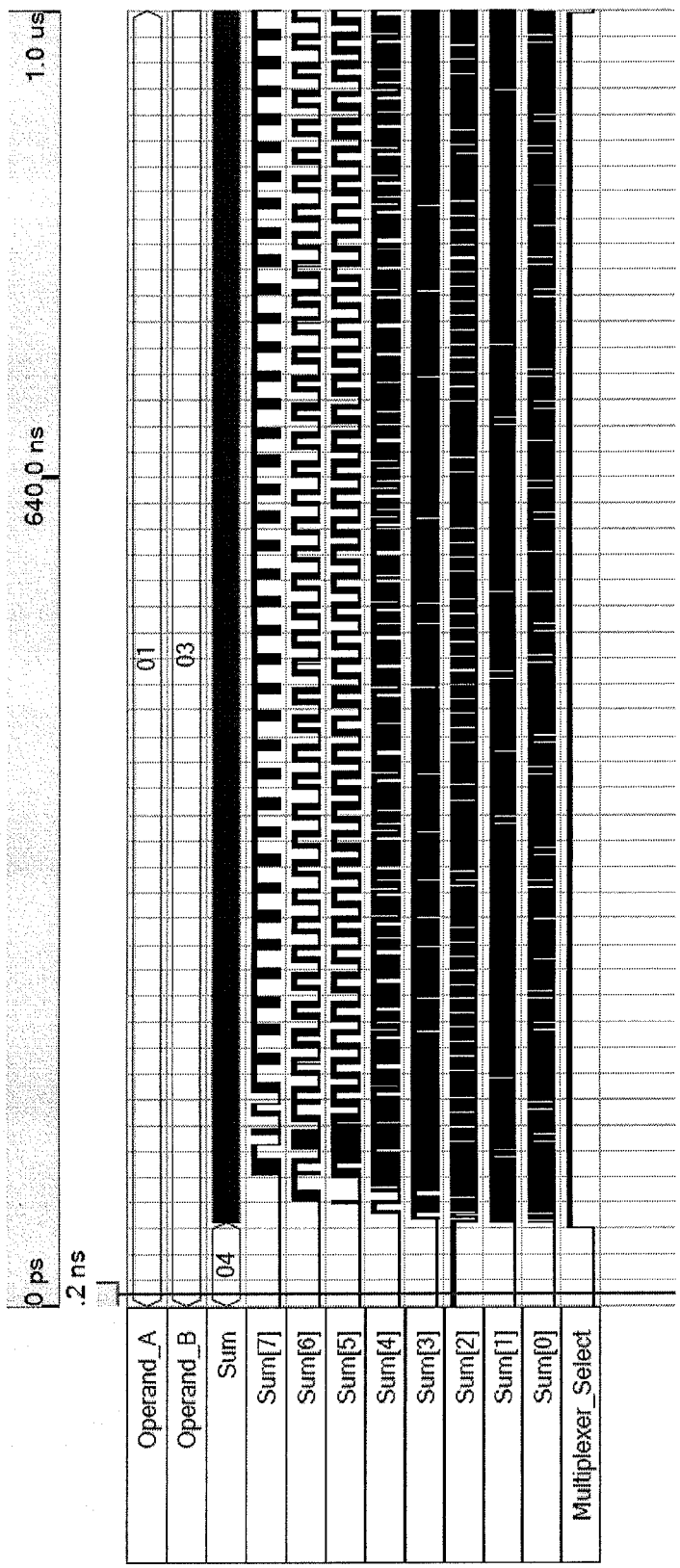
FIGS. 16 and 17 are graphical representations of results generated through the implementation of the adder feedback oscillator of FIG. 15.
Figure 17:
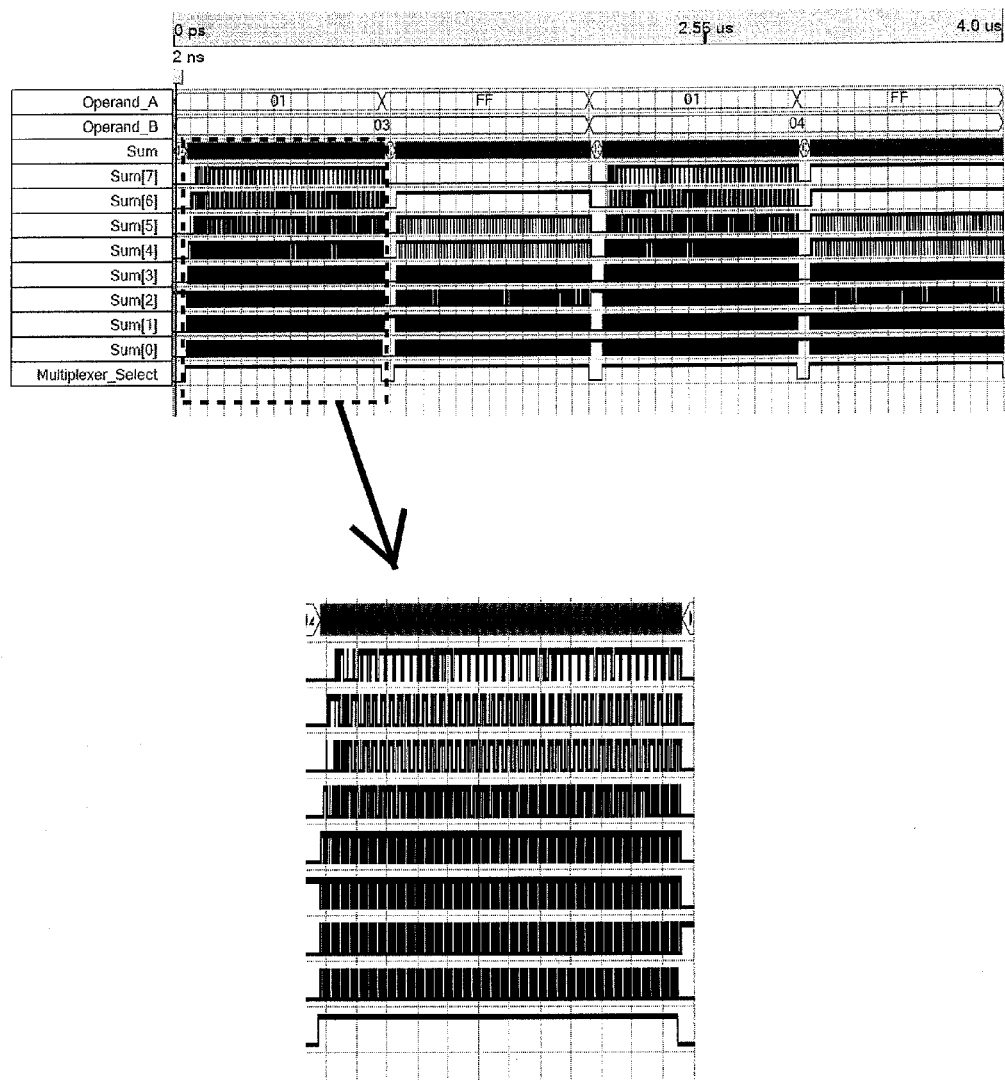

FIGS. 16 and 17 show the output of the adder feedback oscillator 1100 shown in FIG. 15 when the input operands 1014, 1016 are set to the various initial values. When the "Multiplexer Select" 1304 input changes, each of the output values oscillates and each output oscillates at a different frequency. In the complete system, these adder sum outputs would each be connected to an evaluation counter in the same manner that that was implemented with the multiplier feedback oscillator. As shown in FIG. 16 and the blown-up portion of FIG. 17, the least significant bits oscillate in spurts which are easily identified.

Figure 18:
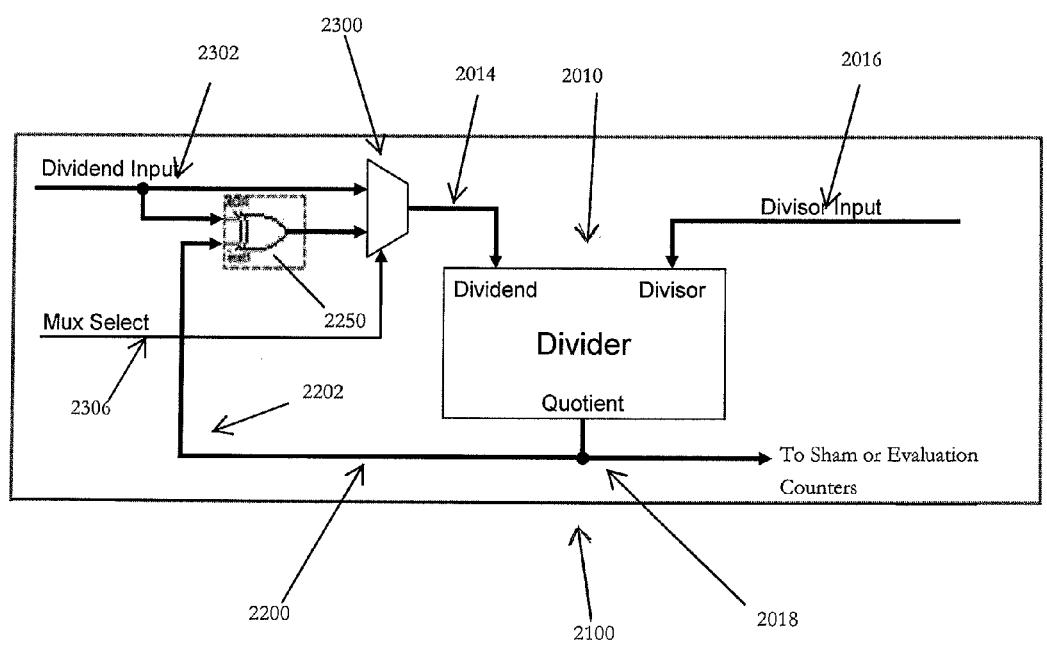
FIG. 18 is a schematic of a divider feedback oscillator in accordance with the present invention.

Similarly, and with reference to FIGS. 18-33, a binary divider 2010 can be made to oscillate in such a fashion. With the binary divider 2010, more circuitry must be implemented to create the oscillation effect. FIG. 18 shows the basic block diagram of the divider feedback oscillator 2100 in accordance with the present invention. As shown in FIG. 18, the binary divider 2010 operates on two inputs, that is, the dividend input 2014 and the divisor input 2016. The dividend input 2014 will be divided by the divisor input 2016 and the quotient result 2018 is the output of the binary divider 2010. The bit-width of the inputs and outputs are related but not critical for this application. The number of bits of the quotient result 2018 plus the number of bits of the divisor input 2016 equals the number of bits (bit width) of the dividend input 2014. For a quotient result 2018 with less bits than the dividend input 2014, it is understood that zeros will be used for higher order bits for the logical eXclusive OR (XOR) 2700. In the divider feedback oscillator 2100 shown in FIG. 18, each bit of the quotient result 2018 is Exclusively ORed with the corresponding bit of the dividend input 2014 to produce the feedback value that may be selected. Similarly to the adder feedback oscillator 1100 and the multiplier feedback oscillator 100, the multiplexer 2300 allows the divider feedback oscillator 2100 to be preset by the initial conditions. When the oscillation is desired for testing, the multiplexer 2300 is switched to allow the feedback of the XOR result (of the dividend and the quotient) into the divider's dividend input.

Figure 19:
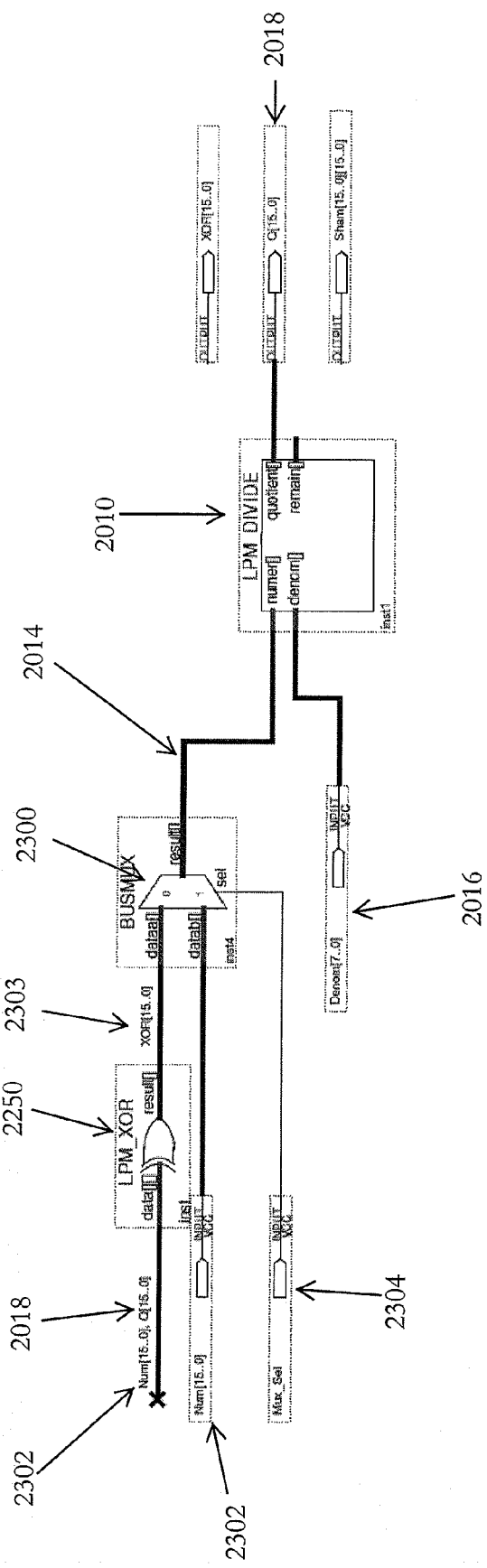
FIG. 19 is a schematic of an implementation of a divider feedback oscillator in accordance with the present invention.
Figure 20:
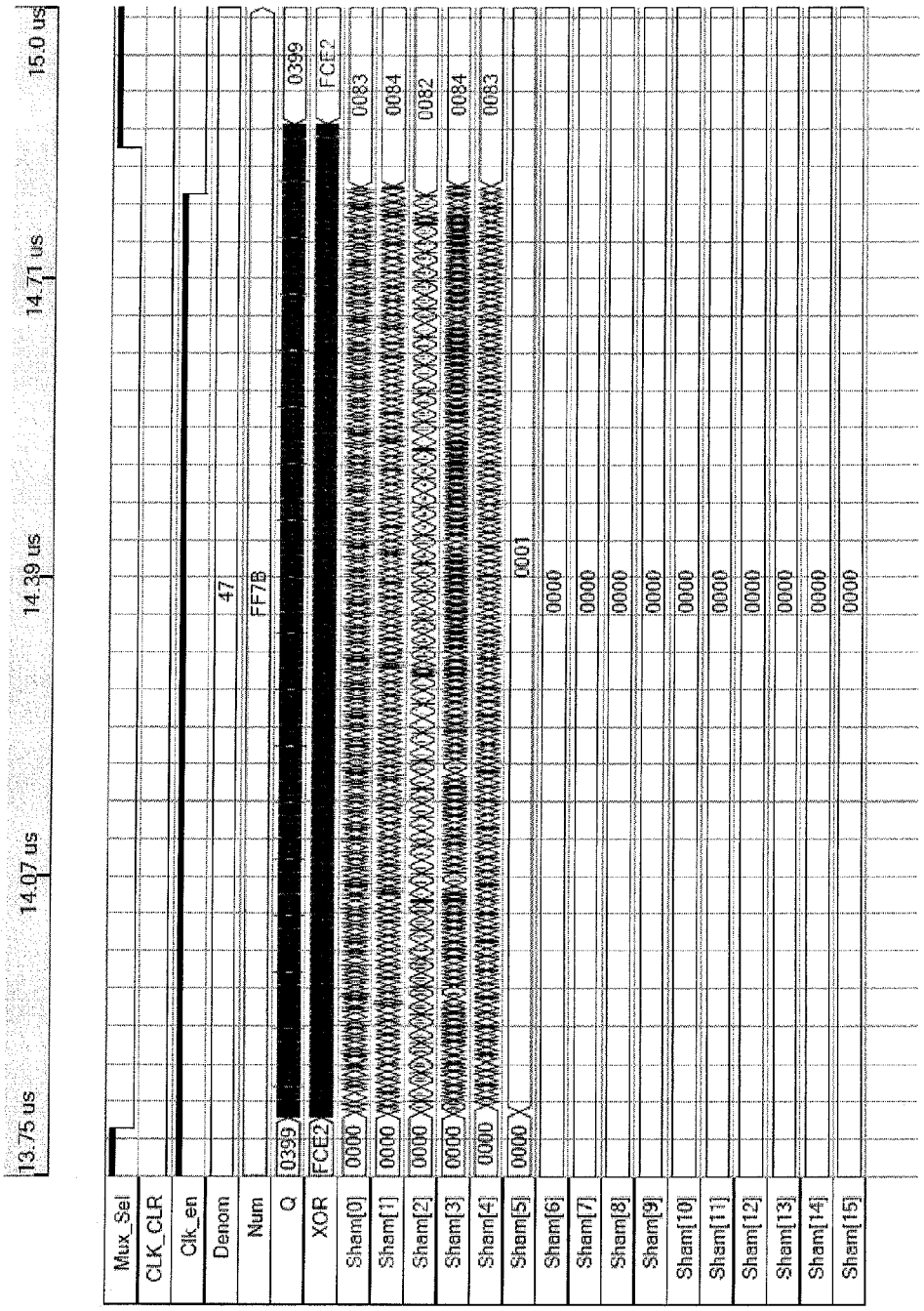
FIGS. 20-33 are graphical representations of results generated through the implementation of the divider feedback oscillator of FIG. 18.
Figure 21:
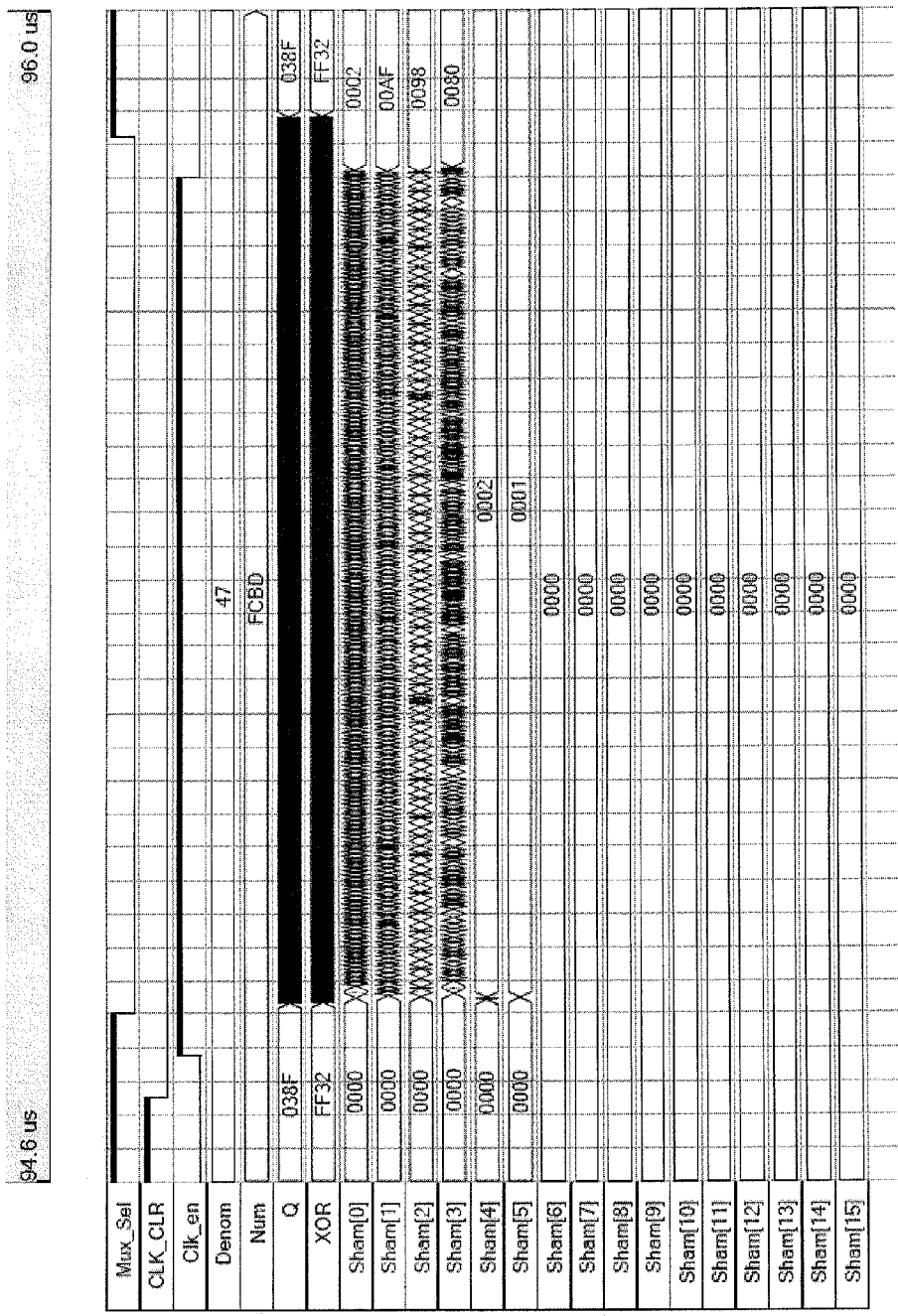
Figure 22:
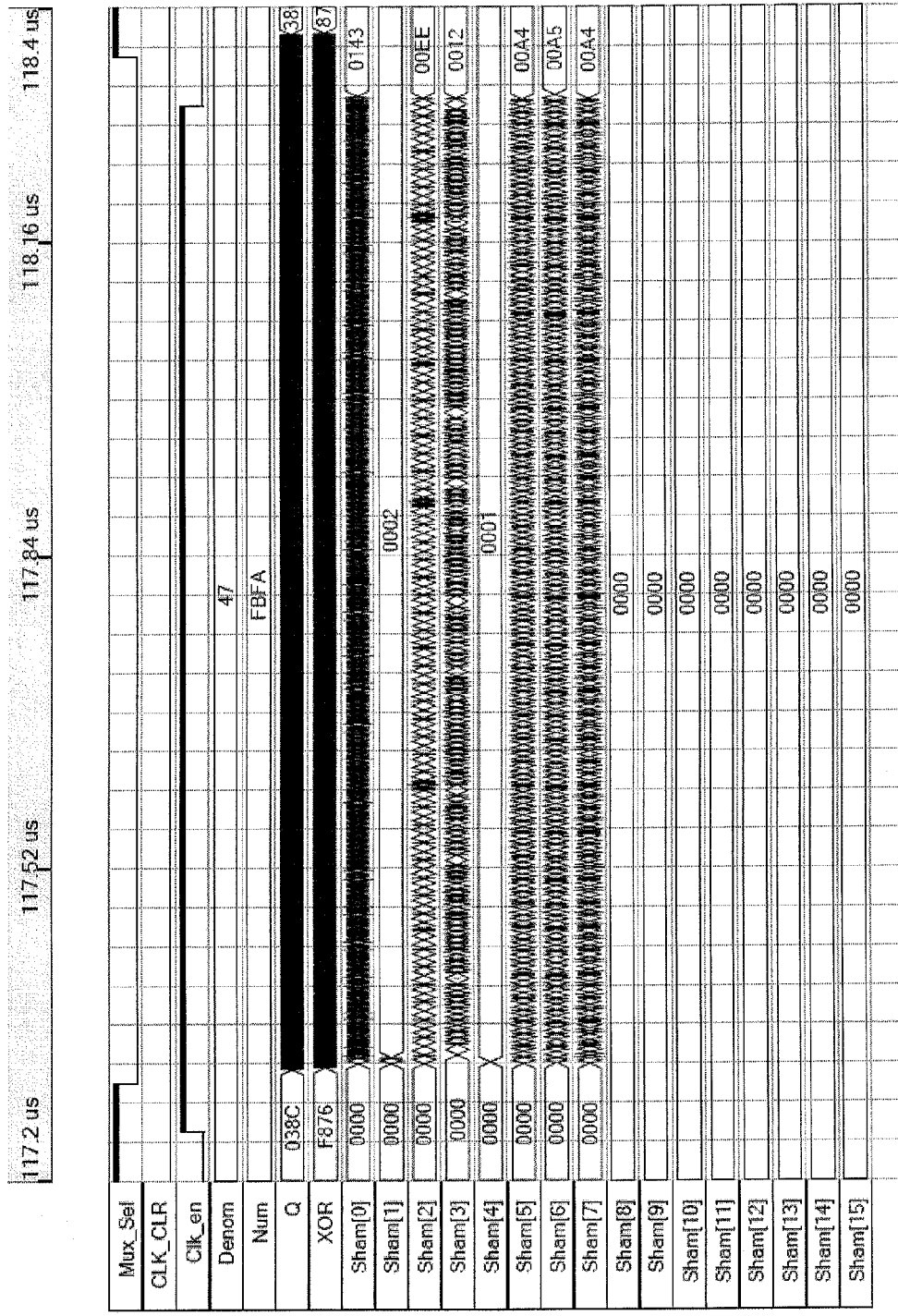
Figure 23:
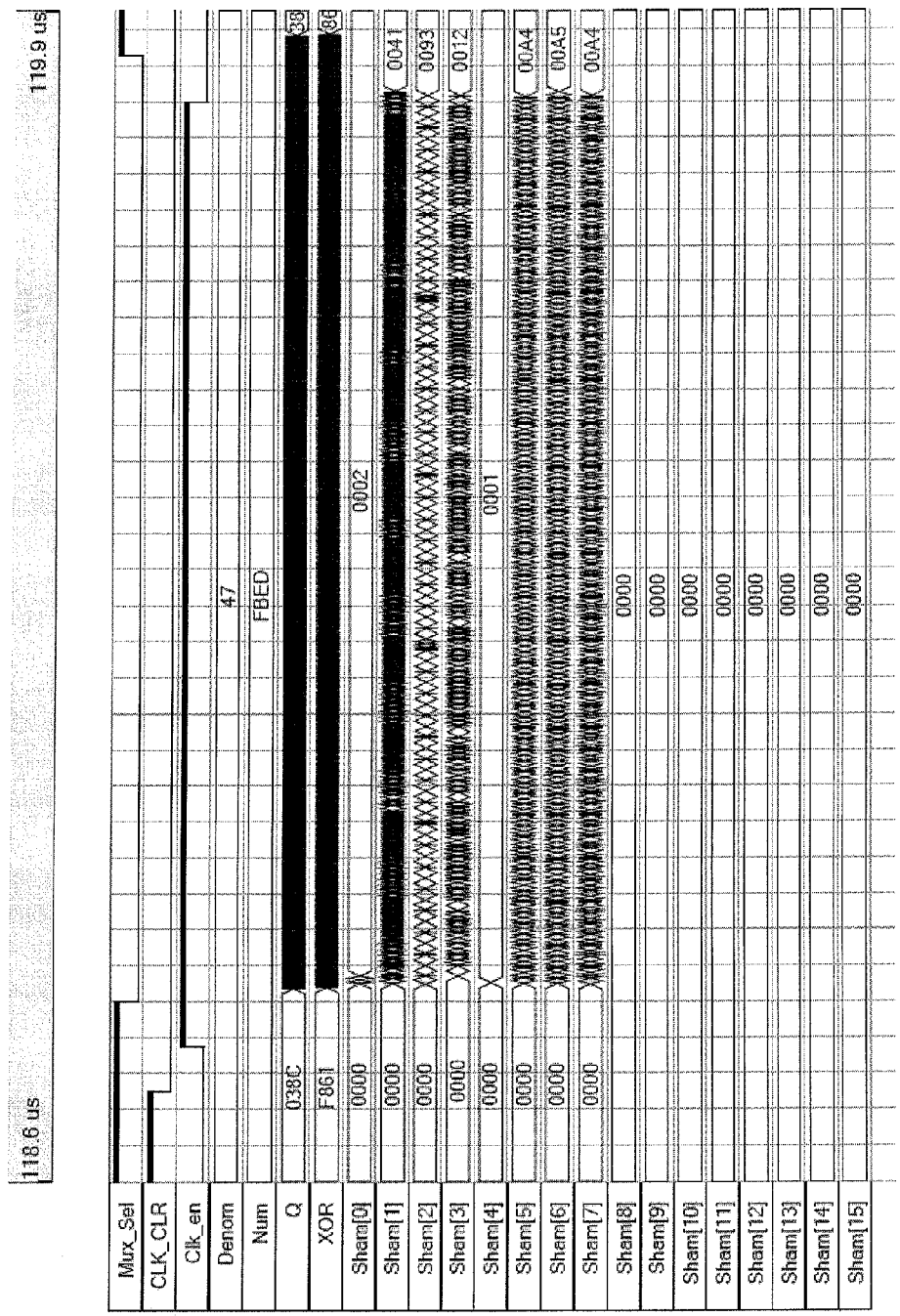

FIG. 19 shows an actual implementation of a sample divider feedback oscillator 2100. In particular, and as with the schematic of FIG. 18, the binary divider 2010 operates on the dividend input 2014 and the divisor input 2016. The dividend input 2014 will be divided by the divisor input 2016 and the quotient result 2018 is the output of the binary divider 2010. Each bit of the quotient result 2018 is Exclusively ORed 2250 with the corresponding bit of the initial dividend input 2302 to produce the feedback value 2303 that may be selected by the multiplexer 2300 based upon the multiplexer select 2304 setting. Similarly to the adder feedback oscillator 1100 and the multiplier feedback oscillator 100, the multiplexer 2300 allows the divider feedback oscillator 2100 to be preset by the initial conditions. When the oscillation is desired for testing, the multiplexer 2300 is switched to allow the feedback of the XOR result 2303 (of the initial dividend input 2302 and the quotient result 2018) into the divider's dividend input 2014.

As with the multiplier feedback oscillator and the adder feedback oscillator systems, the outputs of the divider feedback oscillator 2100 may be routed to binary counters for evaluation in the same manner as described above for the multiplier feedback oscillator with reference to FIG. 9 through 12. FIGS. 20 through 33 show the output of a divider feedback oscillator complete with the results of the evaluation counters. These examples use various divisor (or denominator) and dividend (or numerator) inputs. The resulting oscillations and Sham values are a function of both the dividend and divisor inputs and the unique identity of the multiplier silicon on which the test was performed. In each timing diagram, the divider feedback oscillators are allowed to operate for about one micro second and the evaluation counters are allowed to count for about 0.95 micro seconds. Note that the Sham values are different for each example and for each output indicating that the oscillation frequencies are different.

Figure 34:
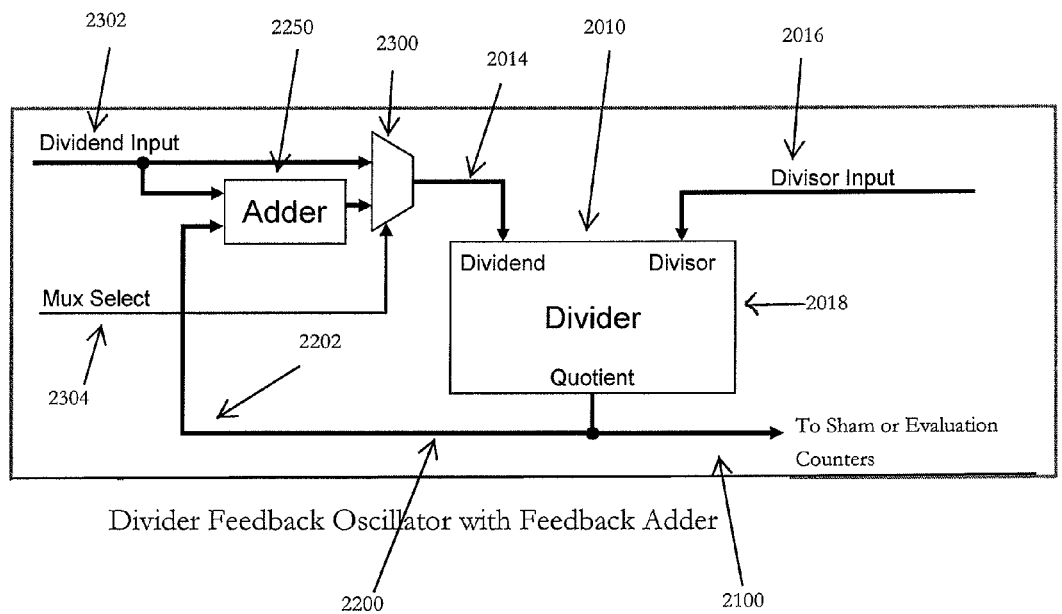
FIG. 34 is a schematic of an alternate divider feedback oscillator in accordance with the present invention.

In the same manner that an XOR operation may be used in the divider feedback loop 2200, an adder 2250 or other functions may also be used. FIG. 34 shows a divider feedback oscillator 2100 implemented using a binary adder 2250 in the feedback loop 2200. U.S. Pat. No. 7,742,597 B2 (Exclusive Encryption, James M. Lewis) describes the development of pseudo adders. These pseudo adders or any other binary function may be used in the feedback loop of the divider feedback oscillator system in accordance with the present invention.

As briefly discussed above, the multiplier feedback oscillator, adder feedback oscillator, and the divider feedback oscillators are members of the arithmetic feedback oscillator family. These devices allow for the authentication and identification of programmable logic devices (PLD) such as field programmable gate arrays (FPGA) and application specific integrated circuits (ASIC). The arithmetic feedback oscillators also provide a method for designing a processor with built in authentication capabilities.

Processors contain an Arithmetic Logic Unit (ALU) that is used to perform mathematical manipulations of the data based on the processor instruction set. Typical ALUs include, as a minimum, Addition, Multiplication, and Division functions. Since the processor already includes an ALU, the only additional circuitry required would be the implementation of the feedback loop and the evaluation counters.

Figure 24:
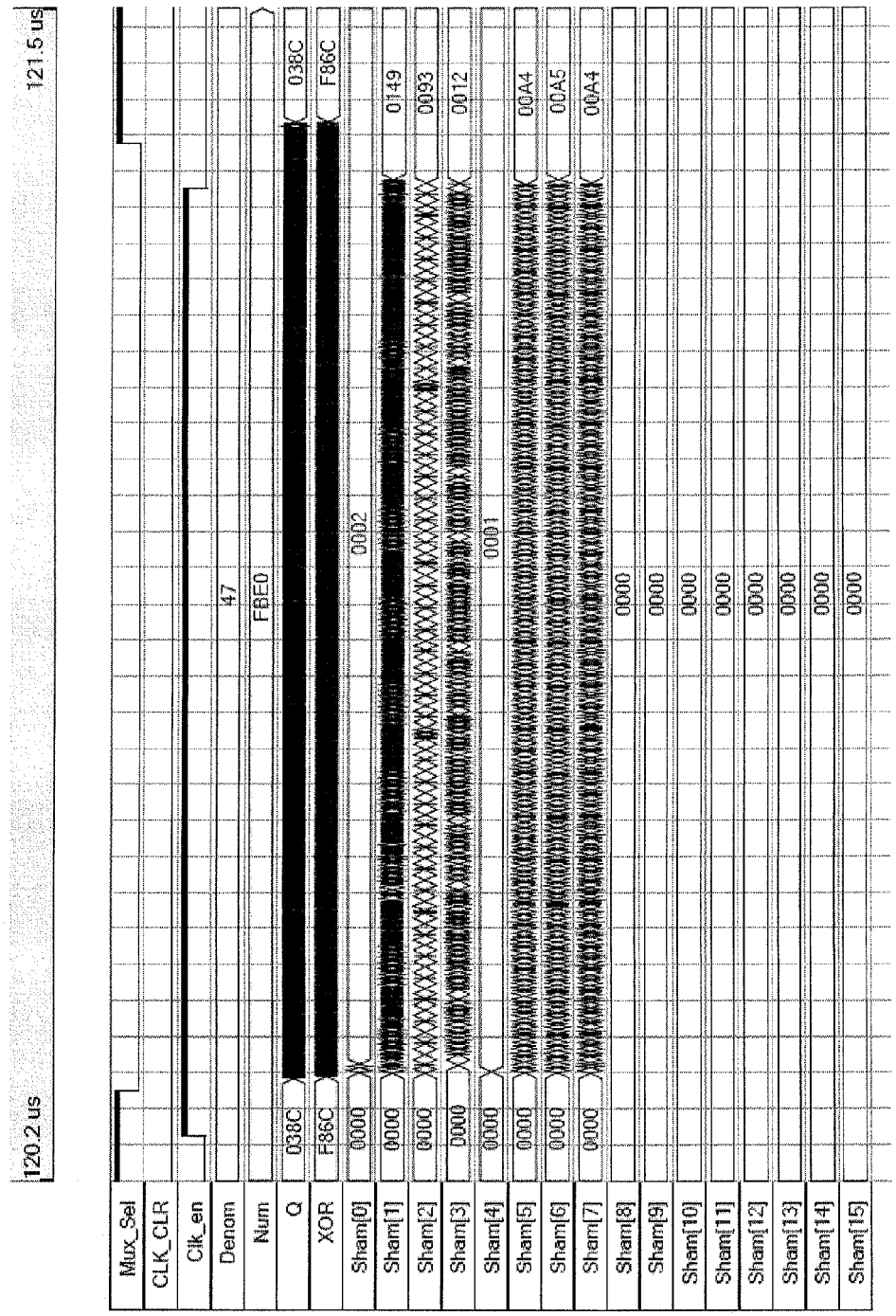
Figure 25:
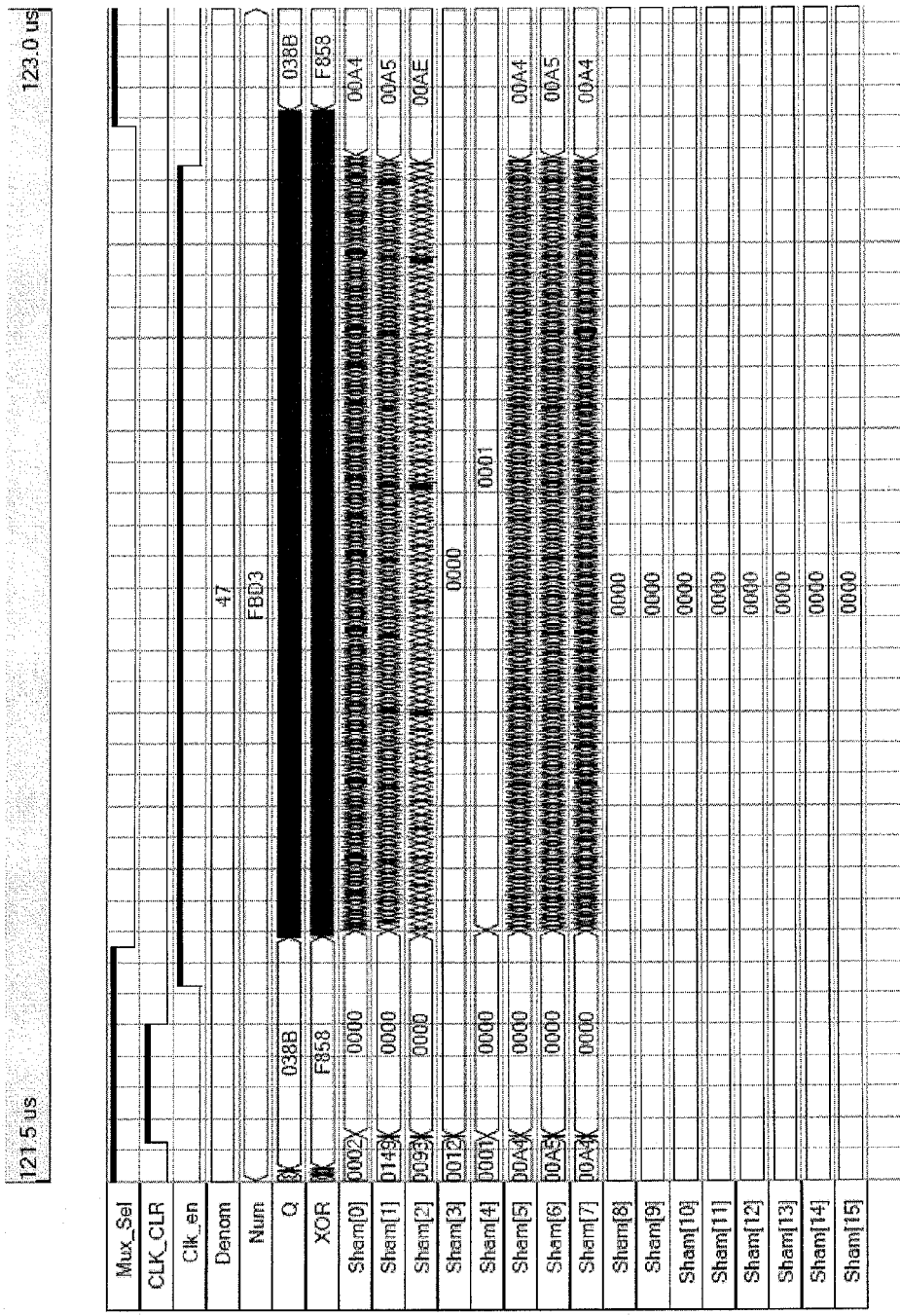
Figure 26:
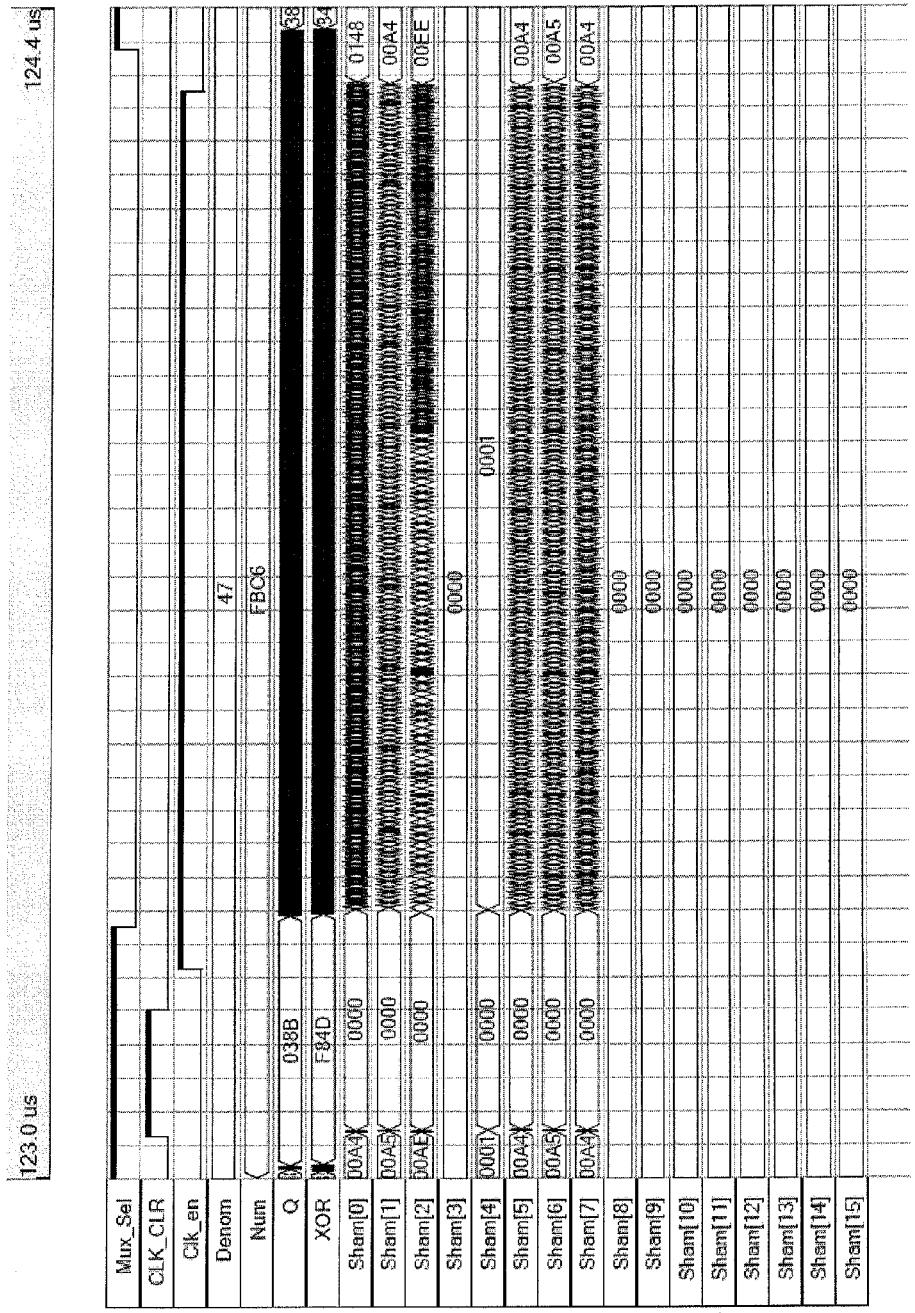
Figure 27:
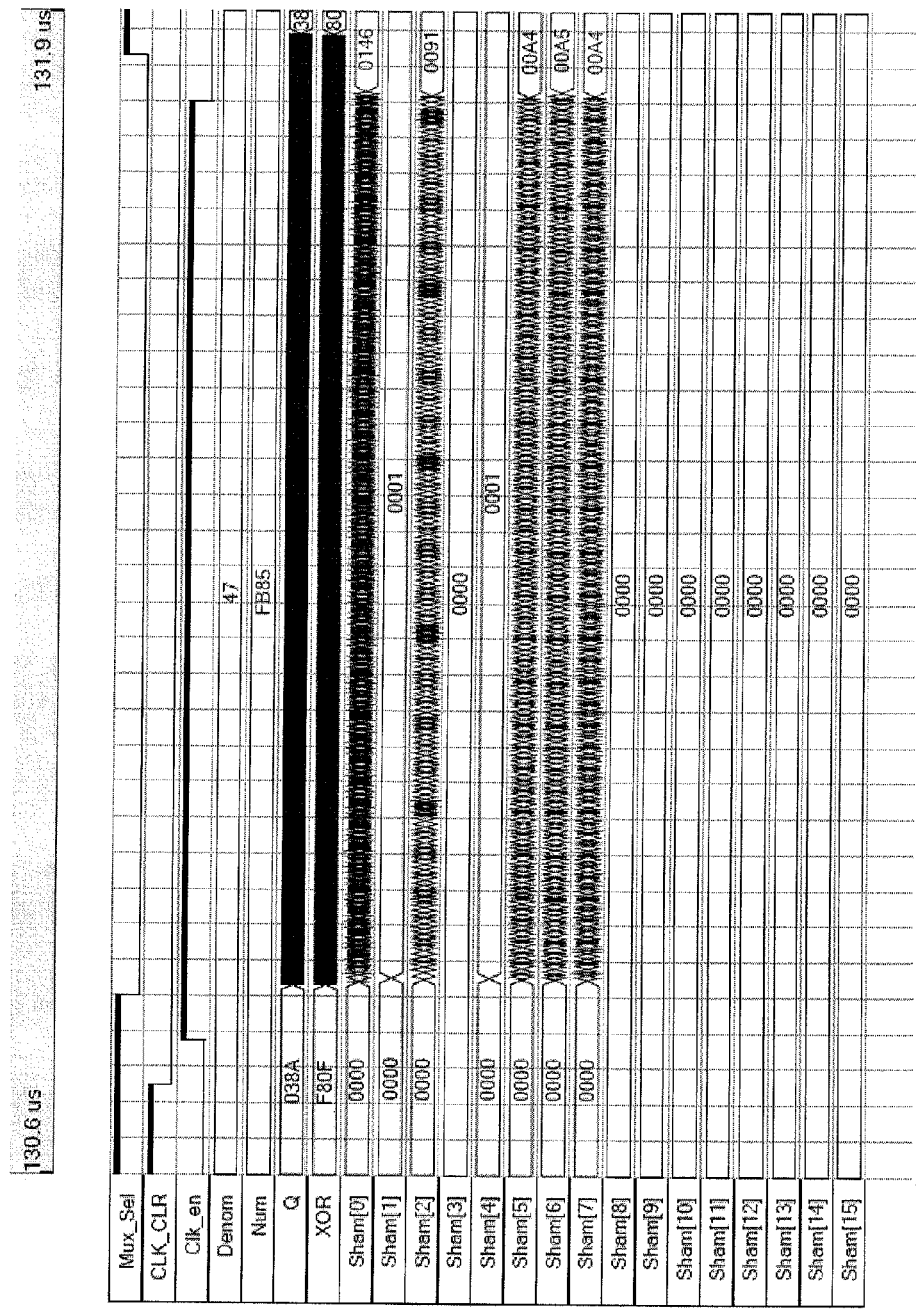
Figure 28:
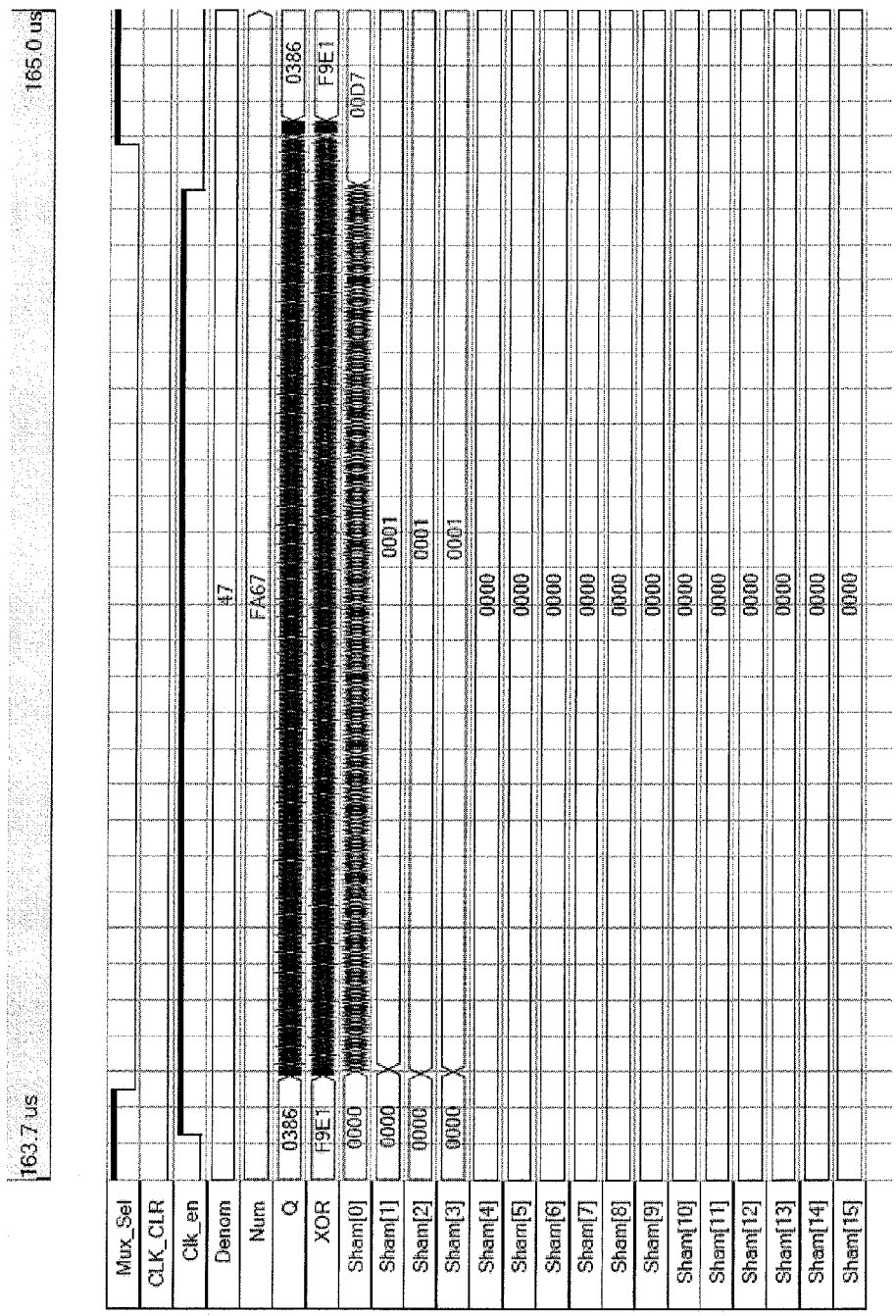
Figure 29:
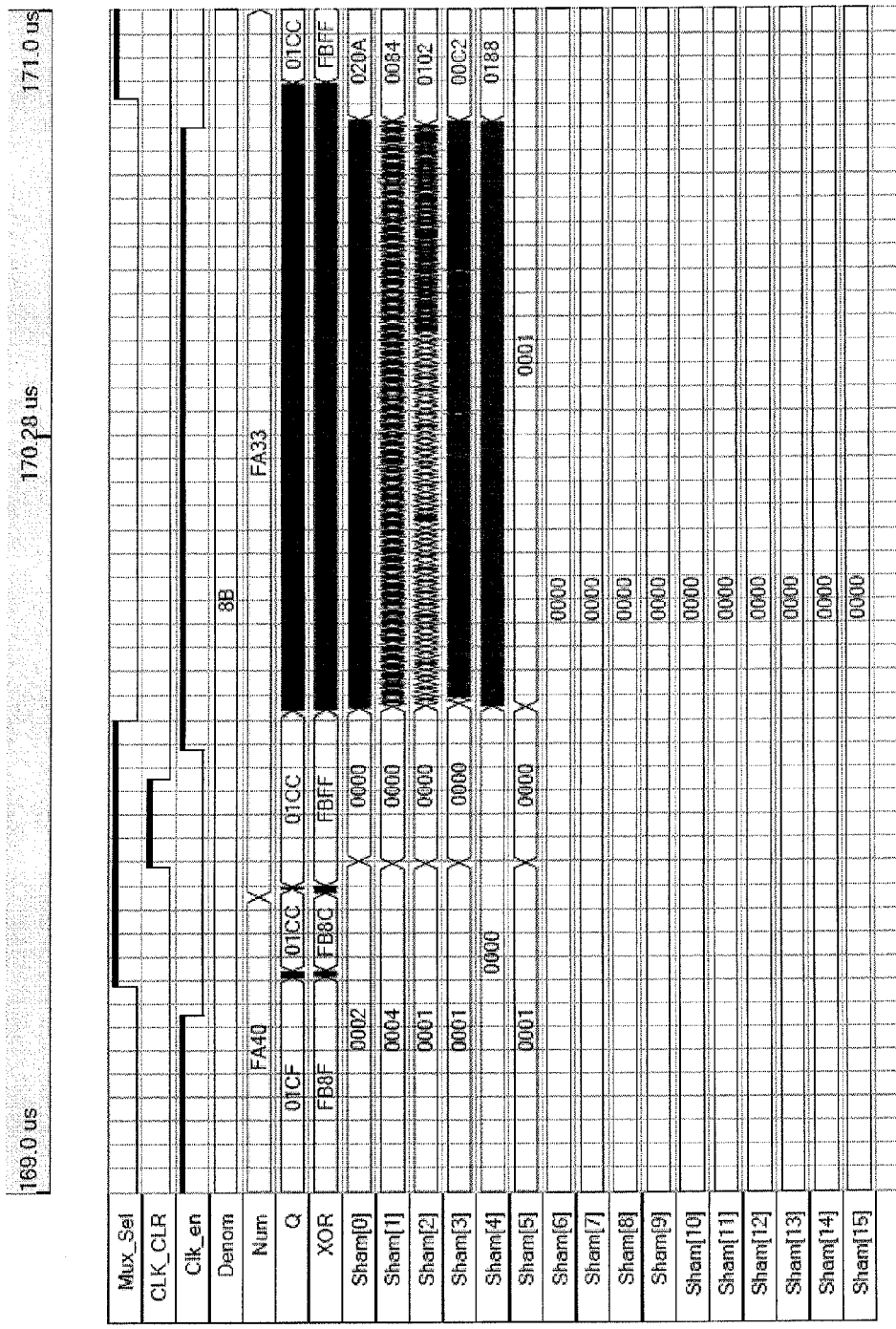
Figure 30:
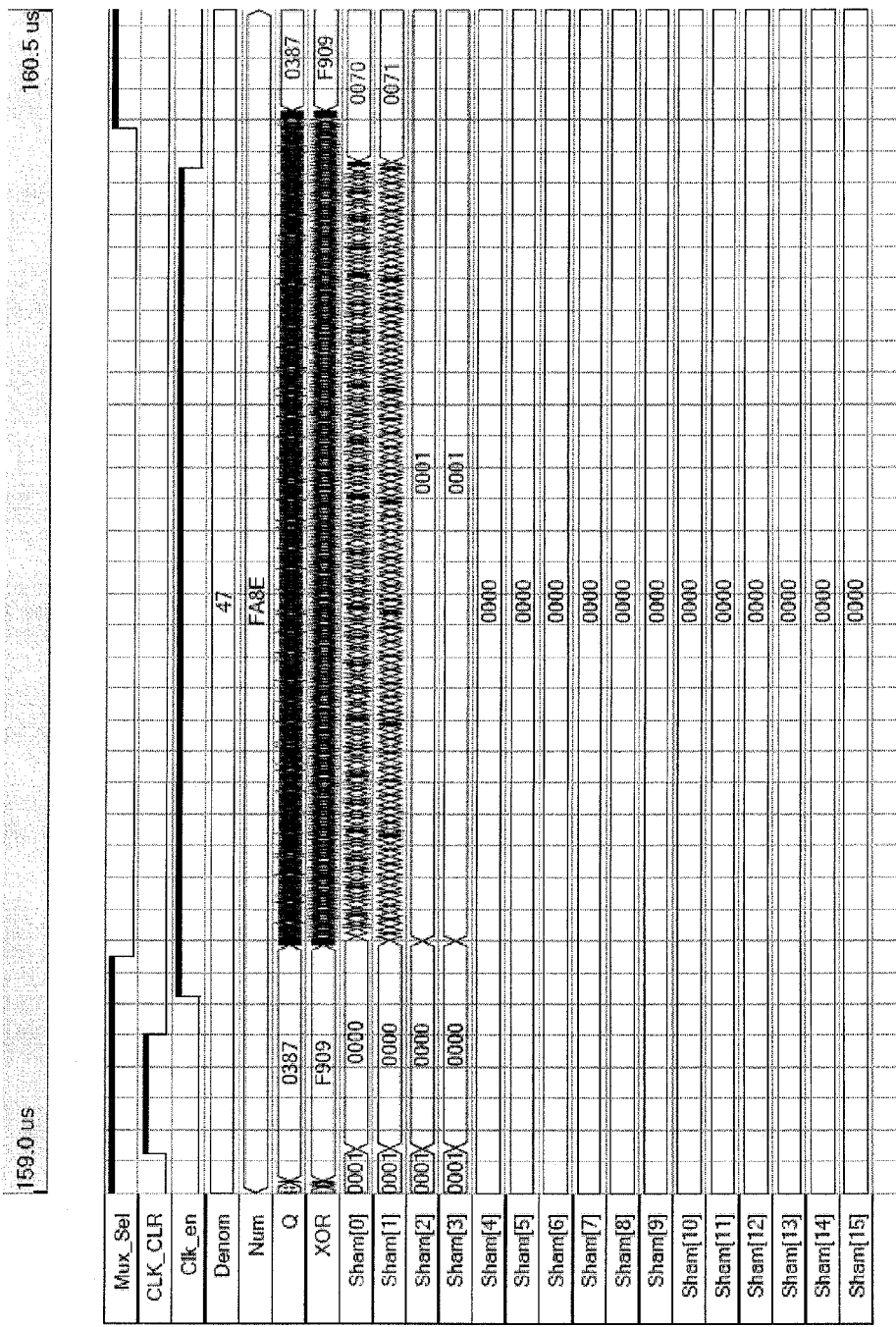
Figure 31:
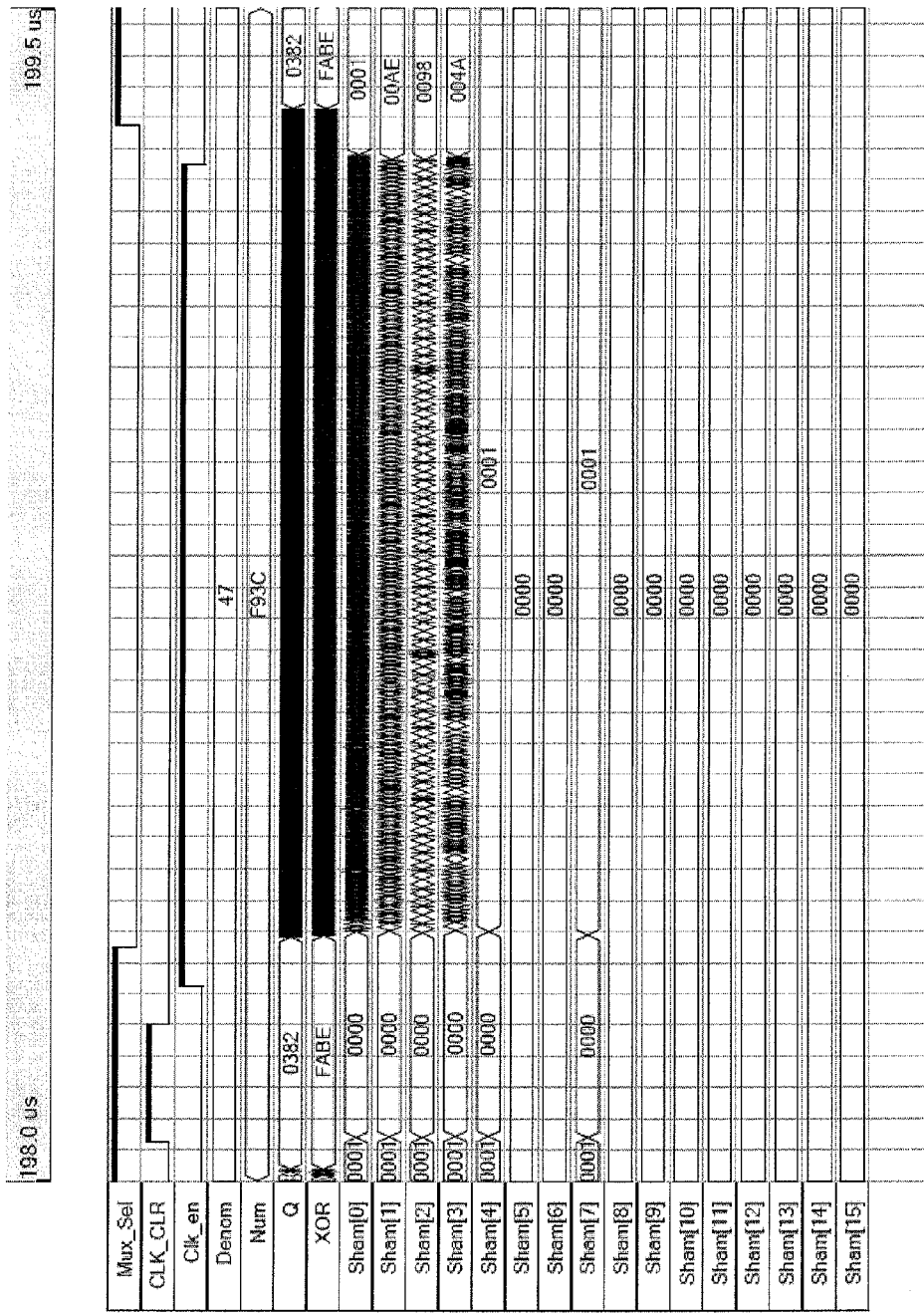
Figure 32:
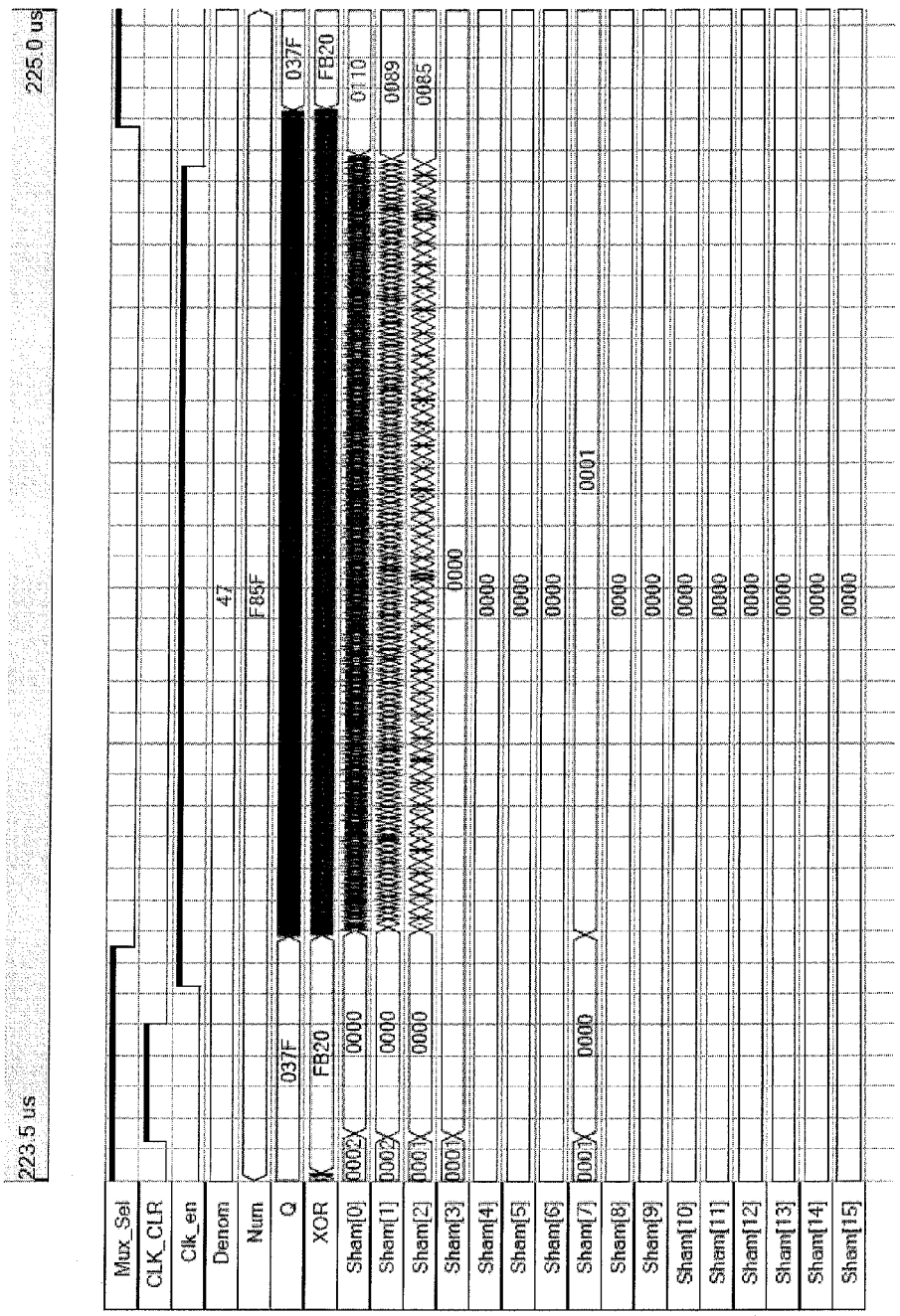
Figure 33:
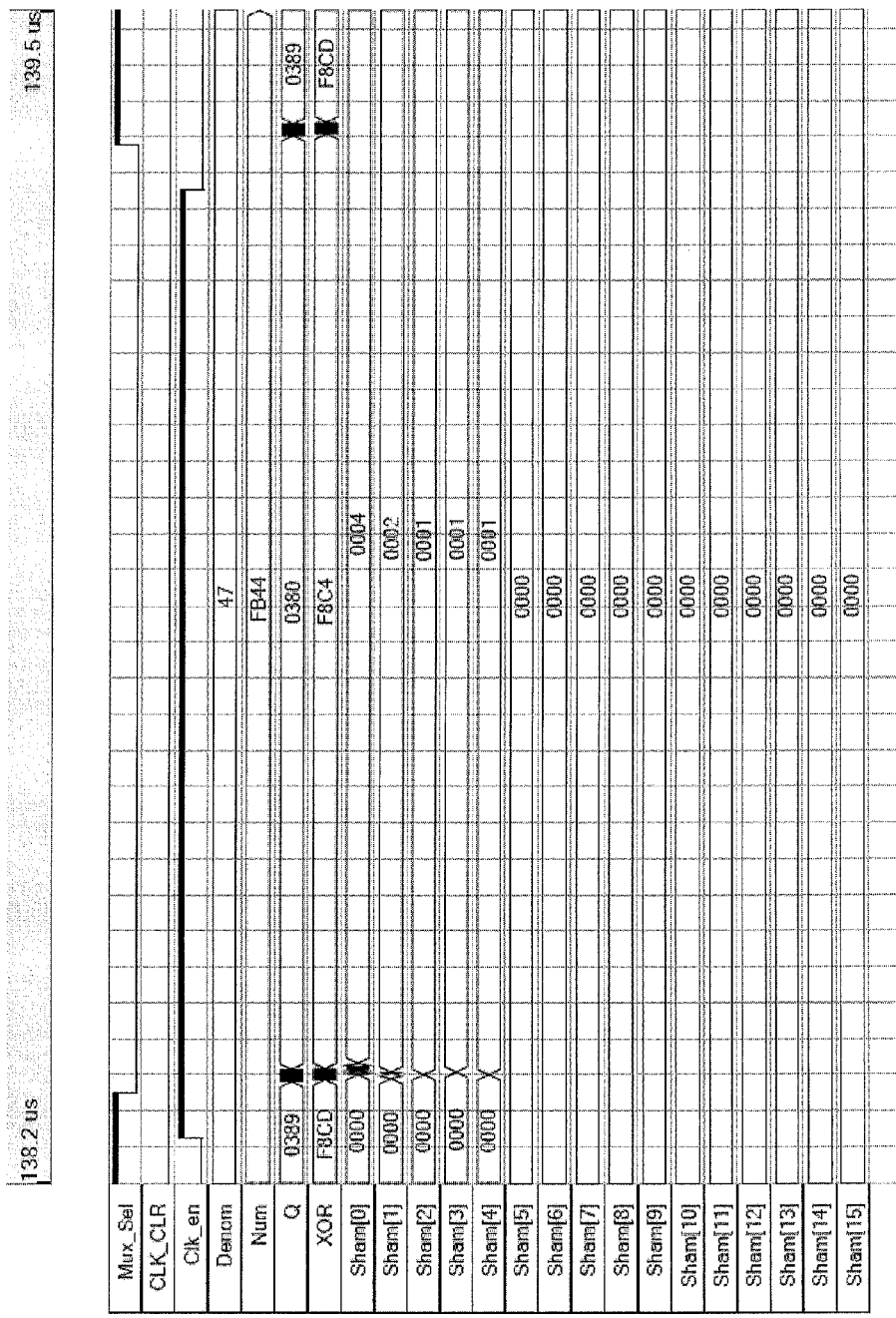
Figure 35:
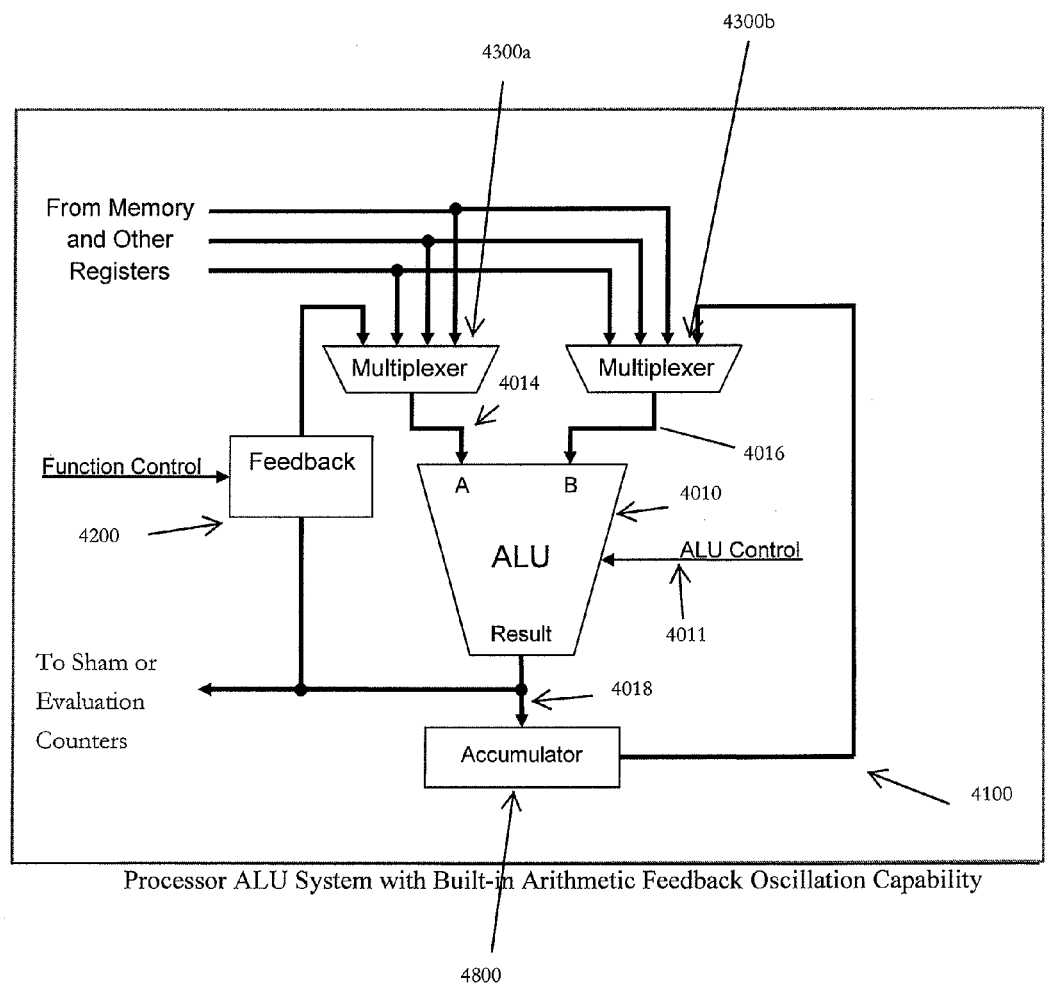
FIG. 35 is a schematic of a feedback oscillator in accordance with the present invention implemented using an arithmetic logic unit.

FIG. 35 illustrates a processor ALU system 4100 with built in arithmetic feedback oscillation capability in accordance with the present invention. (FIG. 24 is not meant to be an exhaustive illustration of processor design, only to illustrate the arithmetic feedback function achieved in accordance with the concepts underlying the present invention.) In this exemplary ALU system 4100 with built in arithmetic feedback oscillation capability, data is multiplexed 4300 into the ALU 4010 from memory locations, special purpose registers, or the Accumulator by multiplexers 4300a, 4300b that are controlled by the instruction decode logic. In normal operation, an instruction to evaluate two operands and store the result in the Accumulator 4800 is implemented by using the multiplexers 4300a, 4300b to route the appropriate data into the ALU 4010 while the ALU Control inputs 4011 are also set by the instruction decode logic. An additional input has been provided to the ALU Multiplexer 4300a, 4300b which allows the ALU output 4018 to rout through Feedback Logic 4200, back into the one of the ALU inputs 4014, 4016. The resulting oscillations are evaluated by evaluation counters connected to the ALU outputs 4018.

By instructing the ALU 4010 to multiply while the Feedback Loop 4200 is routed (through the appropriate multiplexer 4300a, 4300b) back into the ALU 4010, the ALU system 4100 becomes a multiplier feedback oscillator. Similarly, by instructing the ALU 4010 to divide and setting the appropriate feedback function as described previously, the ALU system 4100 becomes a divider feedback oscillator 2100. Many processor ALU also include logic functions such as logical AND, Logic OR, and XOR. These functions may also be employed (with the appropriate input conditions and Feedback Functions) so that the ALU becomes a Logical Feedback Oscillator. Complex functions such as trigonometric functions (sine, cosine, and others), exponential functions (root and exponent generators), and statistical functions may also be utilized to implement Arithmetic Feedback Oscillators.

This system requires that the ALU may be operated in an asynchronous mode and not pipelined or clocked while the Arithmetic Feedback Oscillation is performed.

While the preferred embodiments have been shown and described, it will be understood that there is no intent to limit the invention by such disclosure, but rather, is intended to cover all modifications and alternate constructions falling within the spirit and scope of the invention.

The invention claimed is:

1. A method for combating counterfeiting and tampering of integrated circuits, comprising:
   providing a programmable logic device, the programmable logic device including a multiplier implemented into the substrate;
   constructing a multiplier feedback oscillator using the multiplier wherein the step of constructing the multiplier feedback oscillator includes incorporating a feedback loop into the multiplier and feeding least significant product bits back into one of operand inputs;
   selecting input values producing repeating values in a lesser order bit of a product of the multiplier when first and second operands are applied to the multiplier;
   monitoring the lesser order bit and determining a predicted pattern.

2. The method according to claim 1, including the further steps of obtaining a test integrated circuit and testing to determine if the predicted pattern is produced by the test integrated circuit.

3. The method according to claim 1, wherein the lesser order bit is the zeroth product bit, the $1^{st}$ product bit or the $2^{nd}$ product bit.

4. The method according to claim 1, wherein the multiplier is a binary multiplier.

5. The method according to claim 1, wherein the feedback loop includes a multiplexer.

6. The method according to claim 1, wherein two's complement signed multiplication is employed in the multiplier.

7. The method according to claim 1, further including a binary counter associated with each output bit of the multiplier feedback oscillator.

8. The method according to claim 7, wherein each binary counter receives output bits of the multiplier feedback oscillator for evaluating the frequency of change of the output bits of the multiplier.

9. The method according to claim 8, wherein each of the binary counters produces a time interval over which the bit counters are allowed to operate.

10. The method according to claim 1, further including a register connected to outputs of the multiplier to evaluate the output of the ring oscillator.

11. The method according to claim 1, wherein a time interval generated by a clock or a binary counter is used to control the rate at which data is latched into the register.

12. A method for combating counterfeiting and tampering of integrated circuits, comprising:
   providing a programmable logic device, the programmable logic device including an arithmetic circuit implemented into the substrate;
   constructing an arithmetic feedback oscillator using the arithmetic circuit wherein the step of constructing the arithmetic feedback oscillator includes incorporating a feedback loop into the arithmetic circuit and feeding output bits back into an input of the arithmetic circuit;
   selecting input values producing repeating values in a lesser order bit of a product of the arithmetic circuit when first and second input are applied to the arithmetic circuit;
   monitoring the lesser order bit and determining a predicted pattern.

13. The method according to claim 12, wherein the arithmetic circuit is a binary adder.

14. The method according to claim 12, wherein the arithmetic circuit is a binary divider.

15. The method according to claim 14, wherein the feedback loop includes an XOR function.

16. The method according to claim 14, wherein the feedback loop includes a logic function.

17. The method according to claim 14, wherein the feedback loop includes an binary adder.

18. The method according to claim 12, wherein the arithmetic circuit is a binary multiplier.

19. The method according to claim 12, wherein the arithmetic circuit is an Arithmetic Logic Unit.

20. The method according to claim 12, wherein the feedback loop includes a multiplexer.

21. The method according to claim 12, further including a binary counter associated with each output bit of the arithmetic feedback oscillator.

22. The method according to claim 21, wherein each binary counter receives output bits of the arithmetic feedback oscillator for evaluating the frequency of change of the output bits of the arithmetic circuit.

23. The method according to claim 21, wherein each of the binary counters produces a time interval over which the bit counters are allowed to operate.

24. The method according to claim 12, further including a register connected to outputs of the arithmetic circuit to evaluate the output of the arithmetic feedback oscillator.

* * * * *